United States Patent [19]

Maeda

[11] Patent Number: 4,968,983

[45] Date of Patent: Nov. 6, 1990

[54] RADIATION FIELD CHARACTERISTIC MEASURING APPARATUS

[75] Inventor: Tadahiko Maeda, Yokohama, Japan

[73] Assignee: Kabushiki Kaisha Toshiba, Kawasaki, Japan

[21] Appl. No.: 298,987

[22] Filed: Jan. 19, 1989

[30] Foreign Application Priority Data

Jan. 20, 1988 [JP] Japan .................................. 63-9889

[51] Int. Cl.$^5$ ........................................... G01R 29/08
[52] U.S. Cl. .................................. 343/703; 343/765; 342/360
[58] Field of Search ............... 343/765, 766, 878, 882, 343/703; 342/360

[56] References Cited

U.S. PATENT DOCUMENTS 4,392,140  7/1983  Bastian et al. ........................ 343/765

FOREIGN PATENT DOCUMENTS

| 187273 | 10/1984 | Japan  | 343/703 |
| 44180  | 2/1988  | Japan  | 343/703 |
| 815681 | 3/1981  | U.S.S.R. | 343/703 |
| 987537 | 1/1983  | U.S.S.R. | 343/703 |

OTHER PUBLICATIONS

Microwave Journal, "The Compact Range", Oct. 1974, pp. 30 and 32.
Catalog of ToyO Technica 1985, p. 708, Model Tower 58710A~30A.

Primary Examiner—Michael C. Wimer
Attorney, Agent, or Firm—Oblon, Spivak, McClelland, Maier & Neustadt

[57] ABSTRACT

A radiation field characteristic measuring apparatus comprises a rotating device for rotating a tested object through the total solid angle thereof, and a device for receiving electromagnetic waves radiated from the object, thereby measuring electromagnetic field characteristics of the object with respect to the total solid angle. According to the present invention, almost all the components of the rotating device are formed of a non-metallic material, and spaces to allow the passage of the electromagnetic waves are formed in the components of the rotating device. Thus, reflection and scattering of the electromagnetic waves are suppressed, so that the radiation field characteristics of the tested object, with respect to the total solid angle thereof, can be obtained with high accuracy. Also, the effective radiated power is measured with use of the arrival probability density function of radio waves as a weighting function. By doing this, the evaluation index of an antenna best suited for the actual radio conditions can be obtained.

43 Claims, 25 Drawing Sheets

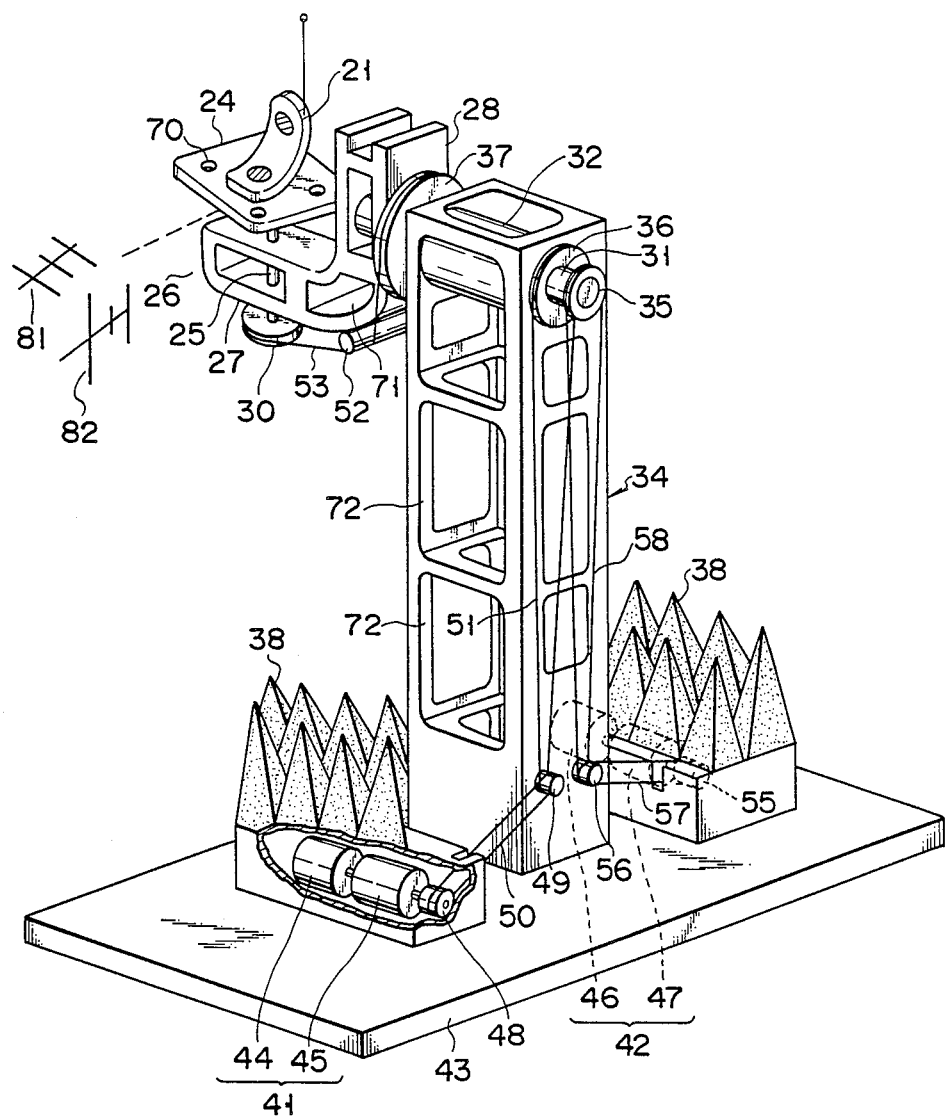
F I G. 3

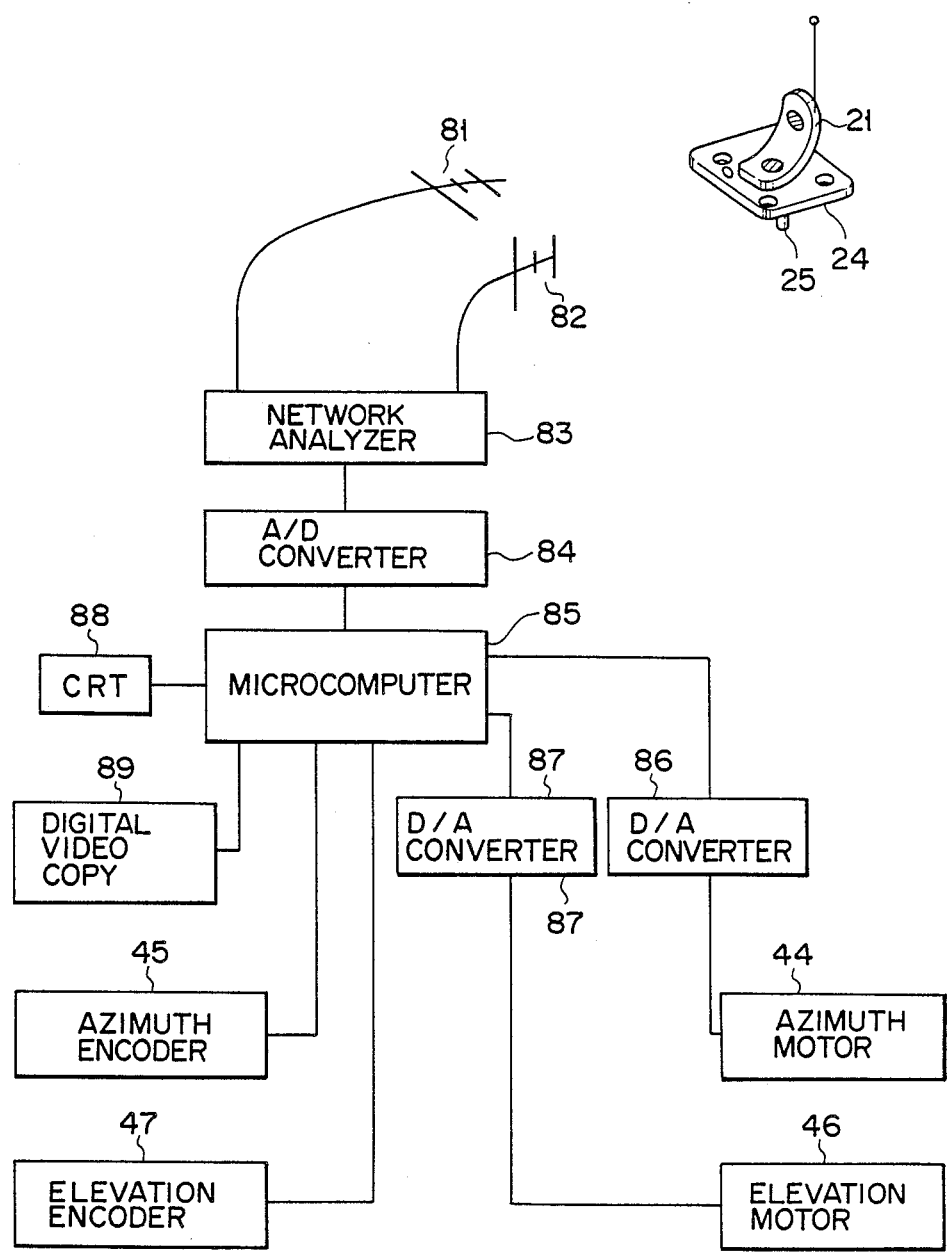
F I G. 8

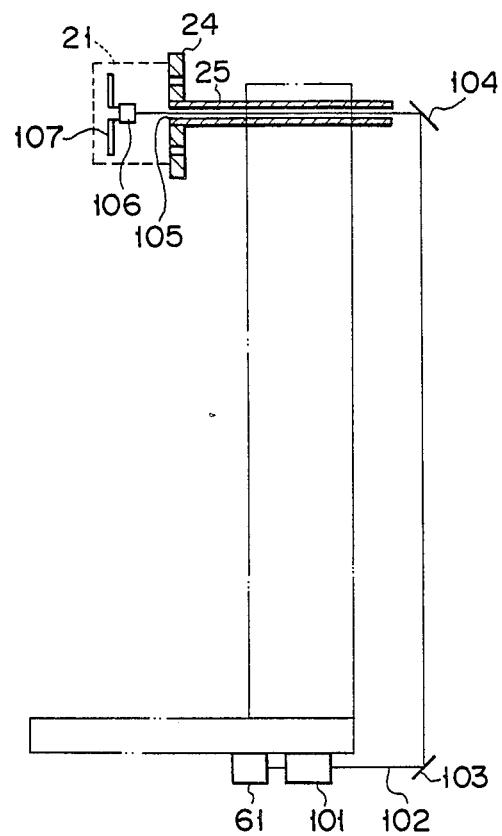
F I G. 11
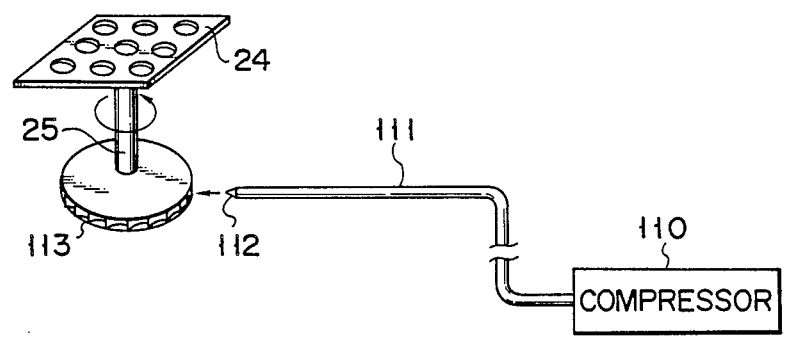
F I G. 12

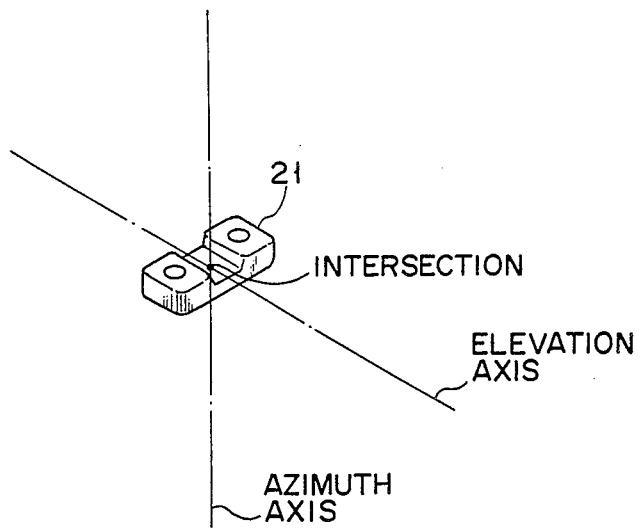
F I G. 15
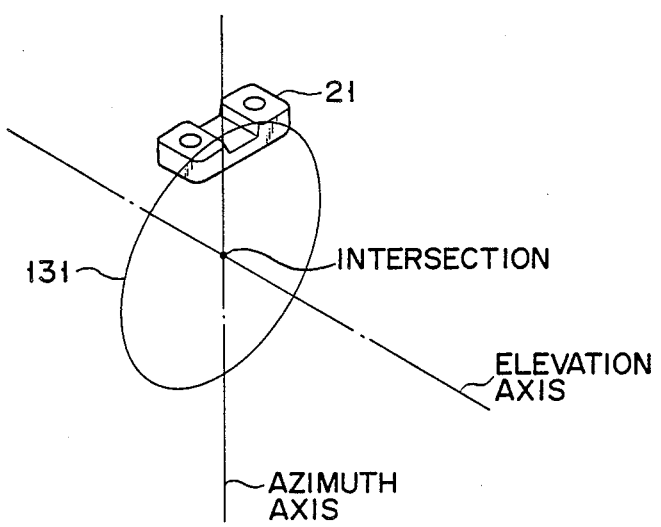
F I G. 16

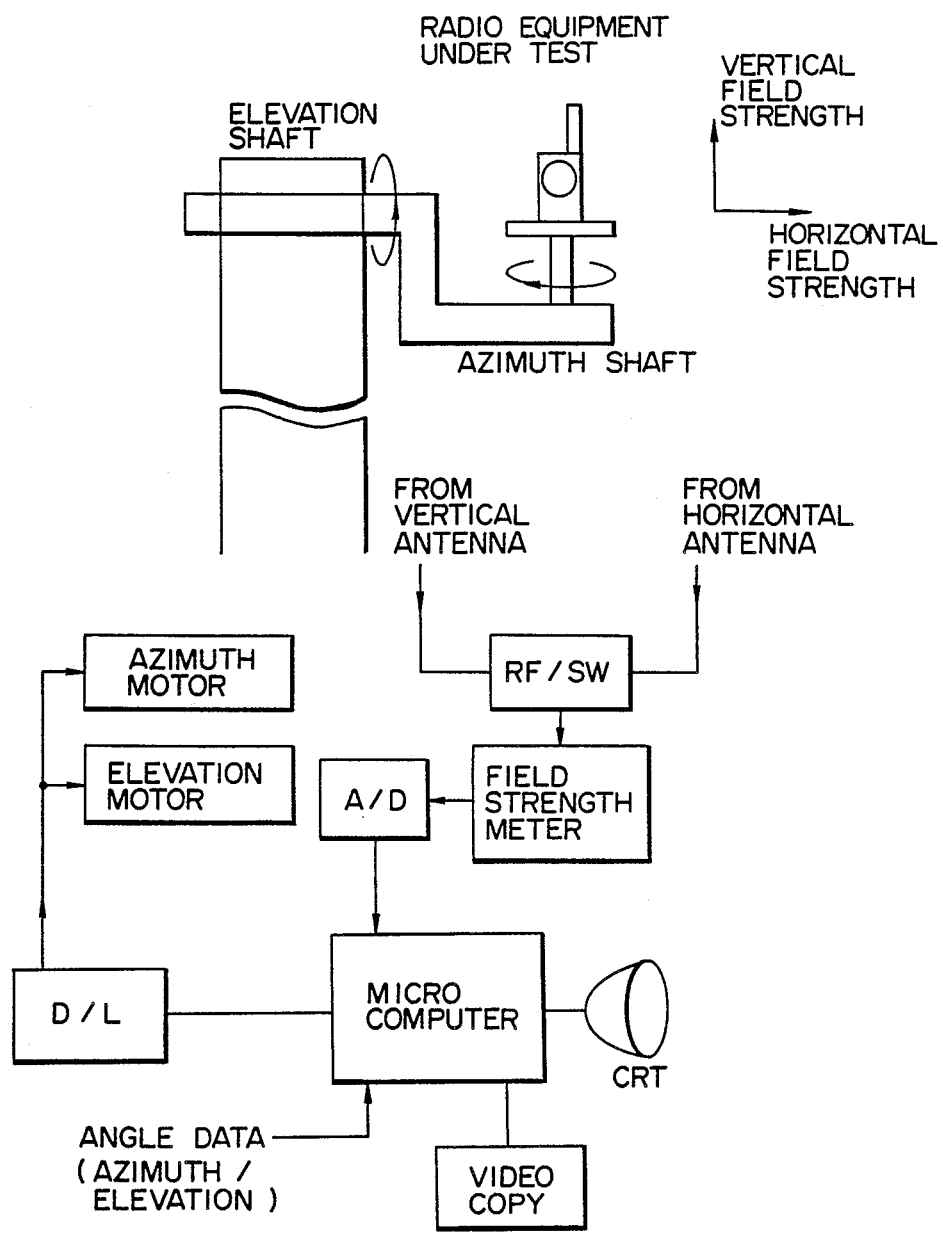
F I G. 17C

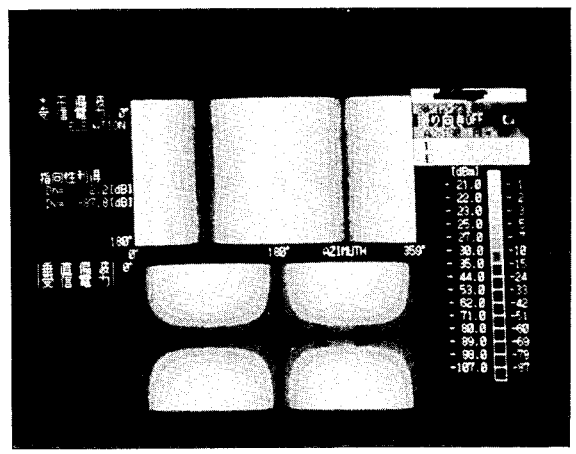
F I G. 19

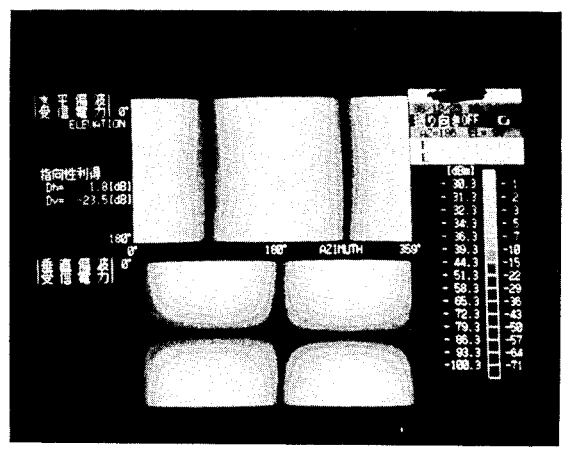
F I G. 21E

F I G. 21F(a)
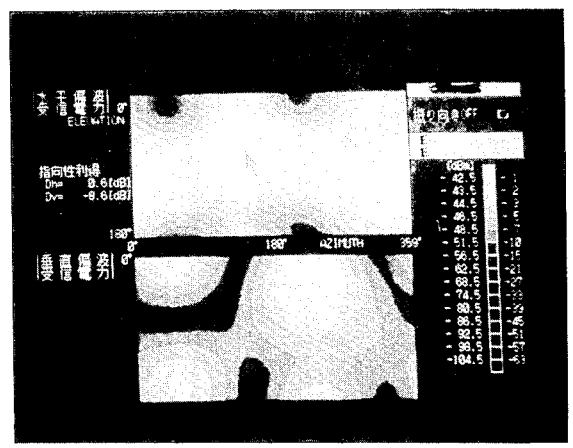
F I G. 21F(b)

RADIATION FIELD CHARACTERISTIC MEASURING APPARATUS

BACKGROUND OF THE INVENTION

1. Field of the Invention

The present invention relates to a radiation field characteristic measuring apparatus, and more particularly, to an apparatus for measuring radiation field characteristics of a radio communication device and the like, with respect to the total solid angle thereof.

2. Description of the Related Art

Recently, radio pagers, cordless telephones, and other portable radio communication devices have been quickly changed into miniature high-function versions. The communication devices of this type are often provided with built-in antennas. In these devices, the characteristics of the built-in antennas are greatly influenced by changes of external environments, such as the conditions of electronic parts. Thus, it is very difficult to develop the built-in antennas independently. The radiation efficiency of the built-in antennas of the communication devices may be considerably lowered due to loss caused by the surrounding electronic parts or users' bodies. In developing the built-in antennas, therefore, they must be designed so that the lowering of their radiation efficiency is minimized Although the input impedance of small antennas can be adjusted relatively easily, it is often difficult for them to realize desired radiation pattern and radiation efficiency. Thus, the built-in antennas must be studied and developed in consideration of the influence of the surrounding electronic parts and the like. There may be two approaches, theoretical and experimental, to the design of the built-in antennas covering these circumstances. In actual product development, however, it is extremely hard to theoretically analyze the radiation characteristics including the influence of the complicated electronic parts, such as printed boards. Naturally, therefore, the experimental approach is required for the analysis of these effects. In order to improve the antenna radiation efficiency by the experimental method, it is necessary to establish a method of antenna radiation efficiency measurement in which the radio communication devices with a built-in antenna can be tested in their actual working state, without the additional use of a measuring cable or the like. In consequence, there is a demand for the development of a measurement method which permits the measurement in the actual working state.

Theoretically, the radiation efficiency of an antenna can be obtained by integrating its radiation field with respect to its total solid angle. Practically, however, it has been regarded as difficult to measure radiation field characteristics of a tested object with respect to the total solid angle, in the VHF or UHF band within which most portable antennas are used. To the knowledge of the inventor hereof, no experimental results on such measurement have hitherto been reported. Thereupon, several other measurement methods for antenna radiation efficiency have been proposed. They include the Wheeler cap method and the Q-factor method, which are based on the measurement of the input impedance of the antenna, and the random field measurement method in which the tested object can be tested in its actual working state. Wheeler proposed the method (Wheeler cap method) in which a miniature antenna is covered by a method cap with a radius of about $\lambda/6$, and the radiation efficiency of the antenna is obtained by measuring the input impedance. Further, E.H. Newman et al. comparatively examined antenna efficiency measurement methods for a multiturn loop antenna based on the Wheeler cap method and the Q-factor method. Basically, these two methods are methods for obtaining the antenna radiation efficiency through the measurement of the antenna's input impedance, so that they can be easily applied to monopole antennas which can be set on a ground plane. In an actual radio communication device, however, the tested object must be fitted with some additional members, e.g., a coaxial cable for impedance measurement, a balun, etc. In measuring low-efficiency antennas with the radiation efficiency of $-20$ to $-30$ dB, such as those for radio pagers and the like, in particular, the balun and the measuring cable used are much larger in size than the built-in antenna. Accordingly, radiation from the cable and the balun greatly influences the measurement accuracy. Also, the efficiency measurement for the antennas of this type is influenced by the accuracy of an impedance measuring equipment.

J.B. Andersen proposed the method (random field measurement method or RFM) in which the effective radiation efficiency of an antenna is obtained from the median of the values of power received by tested portable antennas used in an urban district. The RFM method is an easy method in which measurement can be made in consideration of the influence of users' bodies, without requiring any such large-scale equipment as an anechoic chamber. Requiring outdoor operations, however, this method is subject to some drawbacks; long measuring time, great transmission power, hard operation under bad weather, jamming by external electric waves, etc. In an indoor RFM using radio wave scatterers, as an improved version of the RFM, measurement can be made relatively easily in ordinary laboratories or plants, without attaching any measuring cable or the like to the radio communication device in an actual working state. According to this method, however, the DDD-value is not low in every where, therefore the measuring point must be changed for equalization. Thus, there had not yet been developed measuring apparatuses which can measure radiation characteristics with respect to the total solid angle. In order to seek for the radiation efficiency of the tested object, therefore, a lot of studies have been made.

Meanwhile, new technology, such as the diversity system, will be introduced into future shifting communication, so that it is essential to grasp the radiation directivity of the tested object. Since the radiation directivity of a built-in antenna is different from that of an independent antenna, moreover, the radiation characteristics of the antenna cannot be accurately evaluated by only measuring its specific cut pattern and polarized waves. Thus, in studying built-in antennas, it is important to detect the radiation efficiency and directivity of the object quickly and accurately. Nevertheless, no such measuring apparatuses have yet been reported. Accordingly, it has been impossible to obtain correlation factors for the effective gain and diversity, based on the distribution of the arrival angle of electromagnetic waves, as an essential evaluation index for antennas for moving bodies.

The radiation field characteristics of a tested device with respect to the total solid angle thereof are the characteristics of electromagnetic fields at every point on a sphere or closed curved surface 11 with radius r around tested device 10, as shown in FIG. 1. These radiation characteristics are measured by using means which is equivalent to an arrangement of the tested device at each point on surface 11. More specifically, as shown in FIG. 2, device 10 is rotated around azimuth axis 13 and elevation axis 14, extending at right angles to each other, by means of rotating device 12, as shown in FIG. 2. On the other hand, receiving antenna 15 is situated at a predetermined distance from device 10, and electromagnetic waves received by antenna 15 are signal-processed by means of measurement control device 16. Thus, the radiation field characteristics with respect to the total solid angle are measured.

Conventionally, the rotating device for rotating the tested device is formed of metal. If metallic parts are likely to cause electric waves to scatter, thereby disturbing the measurement results, they are covered by means of a radio wave absorber to prevent the metal from influencing the measurement. If the frequency of the electromagnetic waves used is relatively high, e.g., within the microwave frequency band, the gain of the tested antenna is high, and the directivity is narrow or sharp. Therefore, a satisfactory measurement can be made by setting the metallic parts off the antenna beam. In the case of measuring the characteristics of electromagnetic waves with a relatively low frequency, e.g., within the VHF or UHF band, on the other hand, the following awkward situations will be caused. The rotating device includes a turntable for supporting the tested object and a supporting and rotating mechanism for supporting and rotating the turntable, which are formed of metal, as mentioned before. If the antenna size is fixed, moreover, the antenna gain for the VHF or UHF band is lower than that for the microwave frequency band. Thus, the directivity is wide enough to be applied to a microwave frequency band antenna. In consequence, it is difficult to prevent the antenna beam from being directed toward the metallic parts.

Accordingly, the inventor hereof proposed to improve the rotating device suited for microwaves into one suited for electromagnetic waves within the VHF or UHF band.

More specifically, in order to prevent the electromagnetic waves within the VHF or UHF band from being absorbed or scattered, the inventor hereof proposed to cover one lateral face of the turntable supporting and rotating mechanism by means of a radio wave absorber. In a region of the mechanism in one direction thereof, however, electromagnetic waves emitted from the tested device are absorbed by the radio wave absorber, so that the radiation field characteristics cannot be measured. Since the wavelength of the electromagnetic waves within the VHF or UHF band is relatively long, furthermore, the radio wave absorber must be as tall as about 1 m. Accordingly, there will be a very wide region in which the electromagnetic waves emitted from the tested device are absorbed by the radio wave absorber, and the field characteristics cannot therefore be measured. Thus, the conventional rotating device for microwaves cannot be improved into the one suited for the electromagnetic waves within the VHF or UHF band. This will be described more specifically with reference to a prior art arrangement.

An example of a prior art radiation field characteristic measuring apparatus is mentioned in "Toyo Technica Electronic Measuring Instrument Catalog" (1985), on page 708. In this conventional apparatus (Scientific-Atlanta, Inc. USA Model Tower 58710A series), a turntable for supporting a tested object (e.g., a scale model of an air plane furnished with an antenna) is mounted on the distal end of an azimuth shaft, whose proximal end is rotatably supported on an azimuth post by means of a bearing. The proximal end of the azimuth post is supported in a position eccentric to the center of rotation of an azimuth pedestal, which is supported on an elevation shaft. With this arrangement, the radiation field characteristics can be measured while rotating the tested object on the turntable around azimuth and elevation axes which extend at right angles to each other.

This prior art apparatus is used with a microwave frequency band, and the turntable, bearing, and pedestal are made of metal. Power is transmitted by means of a metallic propeller shaft. Thus, if this apparatus is used with a relatively low frequency band, such as the VHF or UHF band, the following problems arise. In the VHF or UHF band, the radiation characteristics of the tested object are not so sharp as in the microwave frequency band, so that the electromagnetic waves are reflected or scattered by the metallic parts. Thus, a high-frequency current flows through the turntable and the elongated propeller shaft. It is necessary, therefore, to use a radio wave absorber to cover the front portion of the metallic turntable which supports the tested object. In the region behind the turntable with respect to the tested object, therefore, the electromagnetic waves from the object are absorbed, so that the radiation field characteristics cannot be measured at all. With the VHF or UHF band, in particular, the thickness of the wave absorber must be as great as 1 m in consideration of the wavelength, so that unmeasurable regions are too wide to be practical.

Accordingly, there is a demand for the development of an apparatus which can highly accurately measure the radiation field characteristics of a tested device with respect to the total solid angle thereof. Such an apparatus is required particularly for a VUHF-band antenna with a wide beam angle.

In a conventional antenna whose wave arrival probability is not constant with respect to the total solid angle thereof, moreover, its evaluation index is obtained without considering distribution of the arrival angle of radio waves. Thus, the evaluation index of the antenna obtained is not suited for the actual radio conditions. This is because the radiation characteristics of the tested object cannot be measured with respect to the total solid angle.

SUMMARY OF THE INVENTION

A first object of the present invention is to provide an apparatus capable of highly accurately measuring radiation field characteristics of a tested device, with respect to the total solid angle thereof, if electromagnetic waves radiated from the tested device are within the VHF or UHF band.

A second object of the invention is to obtain the evaluation index of an antenna best suited for the actual radio conditions.

According to the present invention, there is provided an apparatus for measuring radiation field characteristics of tested object which radiates electromagnetic waves, the object having a first axis and a second axis extending at right angles thereto, comprising: a first rotating member supporting the tested object; rotating means for rotating the first rotating member around the first and second axes so that the tested object is rotated around the first and second axes; and reception/measurement means adapted to receive the electromagnetic waves from the tested object when the object is rotated around the first and second axes, thereby measuring the radiation field characteristics of the object with respect to the total solid angle thereof, the rotating means including a source of rotatory force for generating a rotatory force for rotating the first rotating member, and supporting and transmission means adapted to support the first rotating member for rotation around the first and second axes and transmit the rotatory force from the source of rotatory force to the first rotating member, the supporting and transmission means including a support for supporting the first rotating member for rotation around one of the axes so that the first rotating member is separated from the source of rotatory force, the support being formed of a nonmetallic material adapted to suppress reflection and scattering of the electromagnetic wave from the tested object, and having a space adapted to allow the electromagnetic waves from the tested object to pass through the support, thereby suppressing the reflection and scattering of the electromagnetic waves.

According to the present invention, the support is formed of a nonmetallic material. Since the relative magnetic permeability of the nonmagnetic material is approximately 1, the reflection and scattering of the electromagnetic waves can be suppressed more than when the support is made of metal. Further, the support has a space which allows the electromagnetic waves to pass through the support. Accordingly, the influence of the nonmetallic material (i.e., dielectric) of the support on the electromagnetic waves can be reduced. In other words, for the electromagnetic waves, the support can be regarded as substantially equivalent to air. Thus, the reflection and scattering of the electromagnetic waves by the support can be further suppressed. In consequence, the radiation field characteristics of the tested object, with respect to the total solid angle thereof, can be accurately measured in the VHF or UHF band.

The effect of the present invention can be noticed from the experimental results shown in FIGS. 19, 20 and 21. FIG. 19 shows the theoretical values of the radiation field characteristics with respect to the total solid angle. FIG. 20 shows test values of the radiation field characteristics with respect to the total solid angle, measured by means of the measuring apparatus of the present invention. FIG. 21 shows test values of the radiation field characteristics measured by means of a measuring apparatus without the space to allow the passage of the waves. Thus, the test values obtained according to the invention agree well with the theoretical values. The test values of FIG. 21 do not, however, agree with the theoretical values at all. Even though the measuring apparatus is formed of a non-metallic material, therefore, accurate measurement cannot be made. If those portions of the apparatus which intercept the tested object are made of metal, the measurement results naturally are disturbed. As is evident from the above description, the radiation field characteristics can be accurately obtained by means of the measuring apparatus of the present invention.

According to the present invention, moreover, the effective radiation power is measured with use of the arrival probability density function of radio waves as a weighting function. Even if the wave arrival probability of the antenna is not uniform with respect to the total solid angle, therefore, the evaluation index of the antenna is obtained in consideration of the arrival probability. Thus, the antenna evaluation index best suited for the actual radio conditions can be obtained.

BRIEF DESCRIPTION OF THE DRAWINGS

FIG. 3 is a perspective view of an apparatus for measuring radiation field characteristics according to a first embodiment of the present invention;

FIG. 8 is a block diagram of a reception/ measurement control device of the apparatus according to the first embodiment;

FIG. 11 is a diagram showing a device for transferring a radio frequency signal by optical means;

FIG. 12 is a diagram showing a device for rotating the turntable by means of compressed air or the like;

FIGS. 15 and 16 are perspective views showing relationships between the tested device and the azimuth and elevation axes;

FIG. 17C is a diagram showing an arrangement of the radiation field characteristic measuring apparatus;

FIG. 19 is a photograph prepared by digital video copying, showing just the same theoretical values of FIG. 18;

FIG. 21E is a photograph prepared by map-displaying measurement results obtained with use of a quartz-oscillation module;

FIG. 21F(a) and 21F(b) show photographs prepared by map-displaying measurement results on a sample radio equipment, in which FIGS. 21F(a) and FIGS. 21F(b) correspond to cases where the mounting angle is 0° and 90°, respectively;

DETAILED DESCRIPTION OF THE PREFERRED EMBODIMENTS

The object of the present invention is to provide a radiation field characteristic measuring apparatus which can measure radiation characteristics of a tested object, with respect to the total solid angle thereof, at high speed, and can visually indicate the radiation characteristics for a one-view survey. First, the measuring apparatus and an improvement of its rotating mechanism, based on preparatory experiments, will be described. Secondly, a method of measurement, including calibration for high-accuracy measurement, will be described. This description will be followed by a description of the results of measurement of a half-wavelength dipole antenna and a sample built-in antenna by means of the apparatus of the invention. Moreover, the measurement accuracy of this measuring apparatus will be examined multilaterally. Finally, the calculation of effective gains, based on the distribution of the arrival angle of electromagnetic waves, will be described to corroborate the effectiveness of the application of the measuring apparatus of the invention to an antenna for moving bodies.

FIGS. 3 to 7A shows a rotating device for an apparatus for measuring radiation field characteristics according to a first embodiment of the present invention, and FIG. 8 shows a reception/measurement control device for the measuring apparatus.

Figure 1:
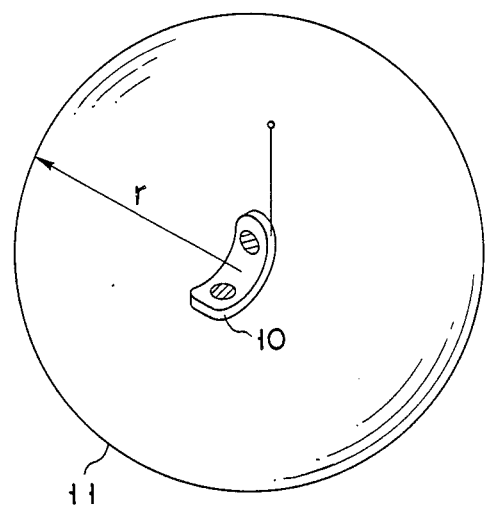
FIG. 1 is a perspective view of a closed curved surface or a sphere surrounding a tested device, for illustrating the total solid angle of the tested device.
Figure 2:
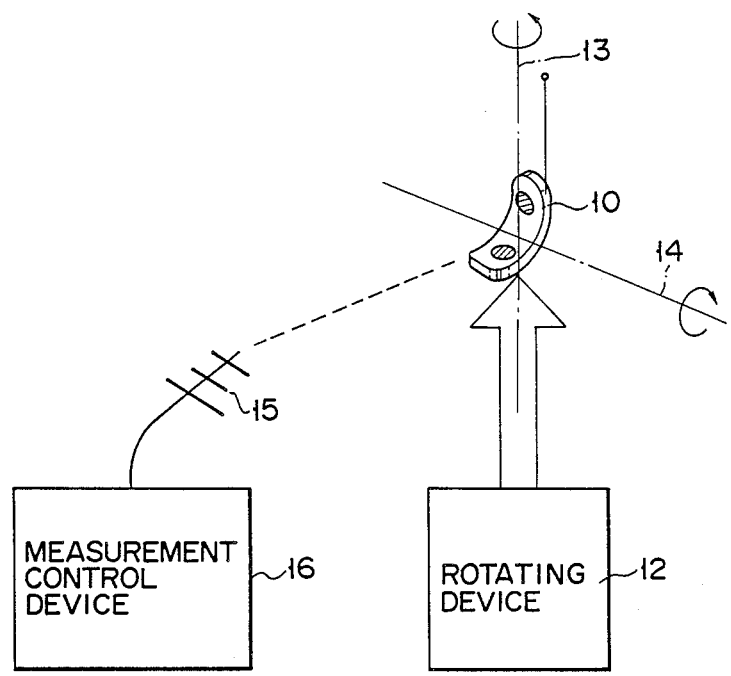
FIG. 2 is a diagram showing a conventional apparatus for measuring radiation field characteristics.
Figure 4:
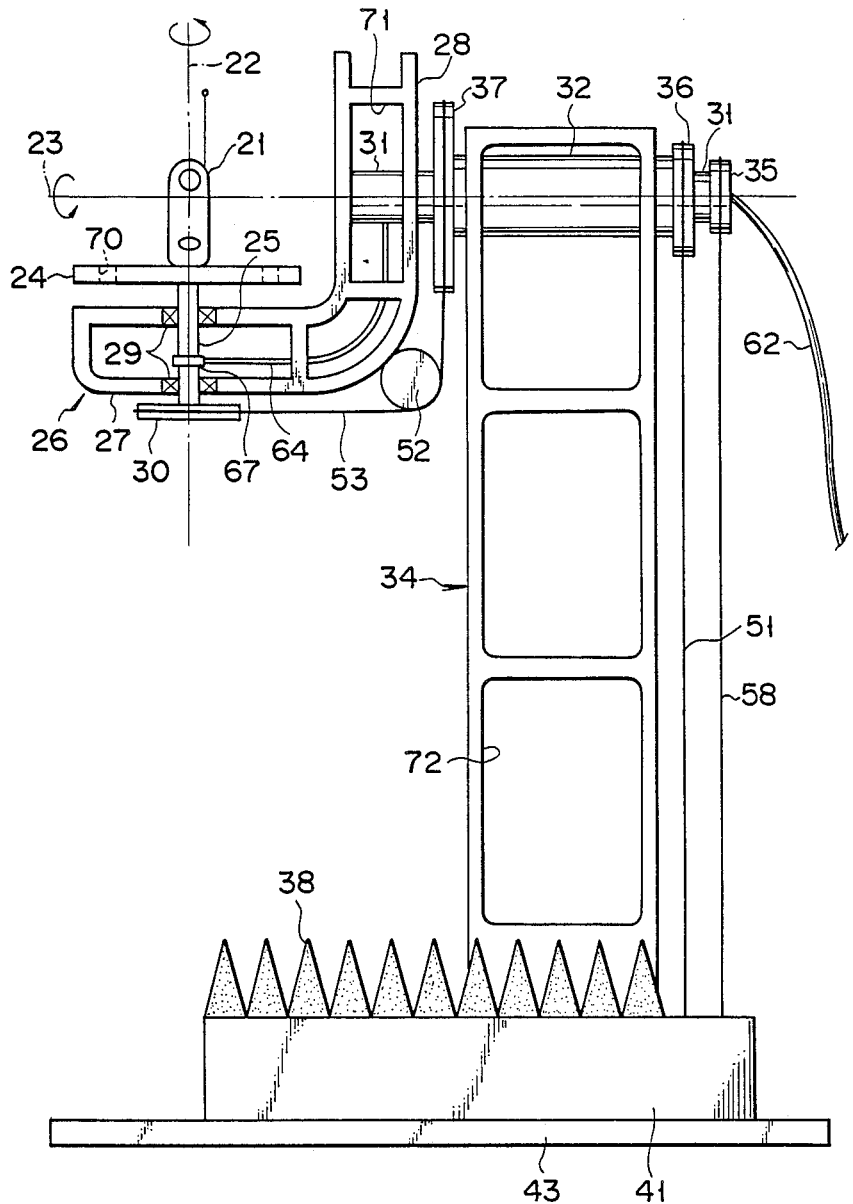
FIG. 4 is a front view of the apparatus shown in FIG. 3.

As shown in FIGS. 3 and 4, a tested object or tested device 21 is a radio communication device containing an antenna, e.g., a cordless telephone. Device 21 is rotated by means of the rotating device. As shown in FIG. 4, the rotating device has azimuth axis 22 and elevation axis 23 perpendicular thereto. Device 21 is rotated 360° around both axes 22 and 23. The intersection of axes 22 and 23 is coincident with the center of rotation of the tested device.

The rotating device comprises a first rotating member or turntable 24 for supporting tested device 21, and rotating means for rotating turntable 24 around first and second axes 22 and 23.

The rotating means basically includes a drive unit or a source of rotatory force for generating a rotatory force to rotate turntable 24, and supporting and transmission means for supporting turntable 24 for rotation around the first and second axes and transmitting the rotatory force from the drive unit to the turntable.

The supporting means, out of the supporting and transmission means, will be described first.

Turntable 24 has azimuth shaft 25 which is coaxial with azimuth axis 22. Turntable 24 is rotatably supported by means of second rotating member 26. Member 26 includes first and second arms 27 and 28 which extend horizontally and vertically, respectively. Azimuth shaft 25 is rotatably supported by means of bearing 29 (FIG. 4) of first arm 27. Pulley 30 is fixed to that end of shaft 25 which projects downward from the first arm.

Figure 5:
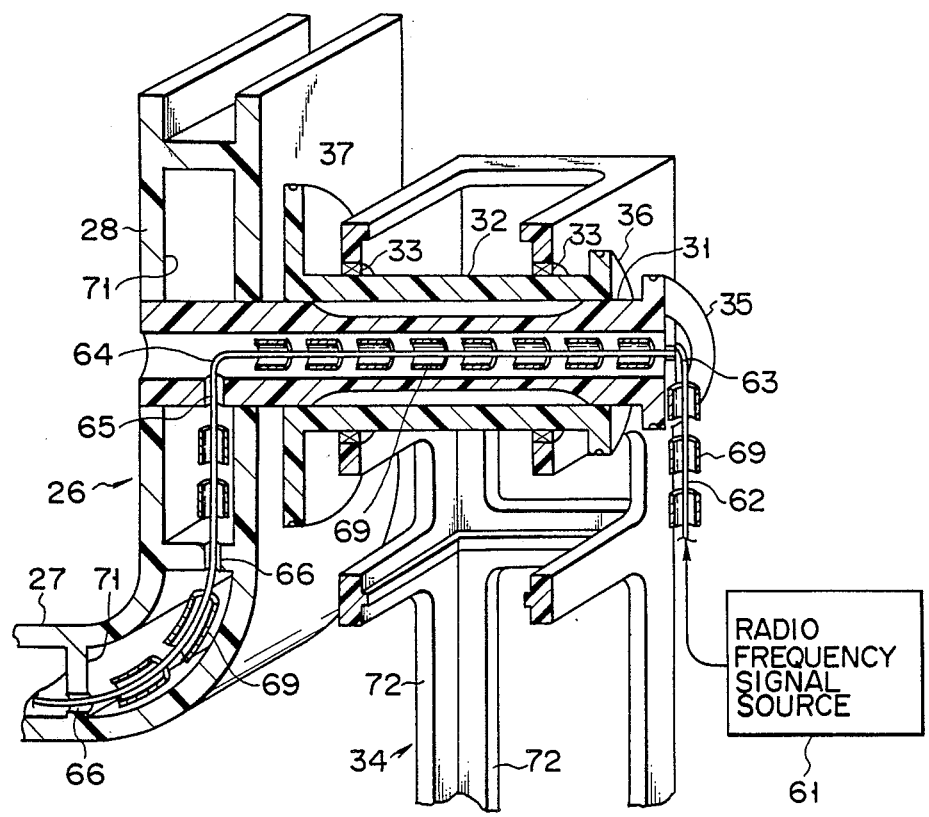
FIG. 5 is a cutaway perspective view showing a first rotating member, a support, and an elevation shaft of the apparatus of FIG. 3.

Second rotating member 26 is rotatably supported by means of support 34 which is set up vertically on base 43. As shown in FIG. 5, second arm 28 of member 26 is fixed to hollow elevation shaft 31 which is coaxial with elevation axis 23. Shaft 31 is rotatably supported within a cylindrical member or azimuth spindle 32. Spindle 32 is rotatably supported by means of bearing 33 of support 34. Pulley 35 is formed at the right-hand end of shaft 31, while pulleys 36 and 37 are formed individually at two opposite ends of spindle 32.

The source of rotatory force is constructed as follows. As shown in FIG. 3, a first rotatory force generator or azimuth drive unit 41 is mounted on base 43. It generates a rotatory force for rotating turntable 24 around azimuth axis 22. Also, a second rotatory force generator or elevation drive unit 42 is mounted on base 43. It generates a rotatory force for rotating turntable 24 around elevation axis 23. Azimuth drive unit 41 includes azimuth motor 44 and azimuth encoder 45. Likewise, elevation drive unit 42 includes elevation motor 46 and elevation encoder 47. Both drive units 41 and 42 are each covered by radio wave absorber 38, e.g., ferrite. The radio wave absorbers shown in FIG. 3 are pyramidal carbon absorbers. The absorbers serve to prevent radio waves from being scattered by the motors and other metallic structures whose essential material cannot be replaced with any other materials than metal. Since the radio wave absorbers do not cut off the tested object from a receiving antenna, there is no inherent problems of conventional apparatus.

The transmission means will now be described. It comprises first transmission means for transmitting the rotatory force around the azimuth axis and second transmission means for transmitting the rotatory force around the elevation axis.

The first transmission means is constructed as follows. As shown in FIGS. 3 and 4, timing belt 50 is passed around and between pulley 48 of azimuth drive unit 41 and pulley 49 of support 34. Timing belt 51 is passed around and between pulley 49 and pulley 36 of azimuth spindle 32. Timing belt 53 is passed around and between pulley 37 of spindle 32 and pulley 30 of azimuth shaft 25 with the aid of roller 52. Thus, a rotatory force produced by motor 44 is transmitted to azimuth shaft 25 through belt 50, pulley 49, belt 51, pulley 36, azimuth spindle 32, pulley 37, belt 53, and pulley 30. Accordingly, turntable 24 is rotated around azimuth axis 22.

On the other hand, the second transmission means is constructed as follows. Timing belt 57 is passed around and between pulley 55 of elevation drive unit 42 and pulley 56 of support 34. Timing belt 58 is passed around and between pulley 56 and pulley 35 of elevation shaft 31. Thus, a rotatory force produced by motor 46 is transmitted to elevation shaft 31 through belt 57, pulley 56, and belt 58. Accordingly, second rotating member 26 is rotated around elevation axis 23, so that turntable 24 is rotated around axis 23. In other words, member 26 serves not only to support turntable 24, but also to transmit the rotatory force of elevation shaft 31 to the turntable. Thus, the rotatory force of shaft 31 is transmitted through second rotating member 26 to turntable 24.

In this first embodiment, moreover, a radio frequency signal is supplied to tested device 21. Thus, the measuring apparatus of this embodiment can also measure the electromagnetic field characteristics of devices without a transmitter, receiving antennas, etc.

Figure 6:
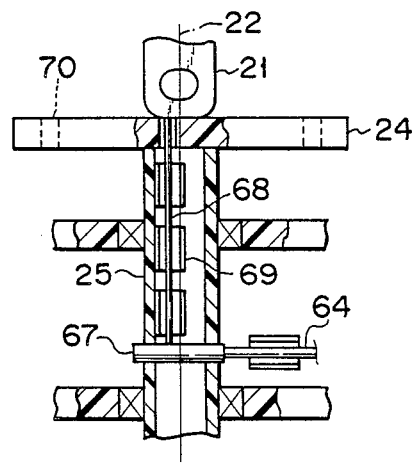
FIG. 6 is a partial sectional view showing a turntable and an azimuth shaft of the apparatus of FIG. 3.

As shown in FIG. 5, the measuring apparatus is provided with radio frequency signal source 61. Signal source 61 is connected to rotary joint 63 at the right-hand end of elevation shaft 31 by means of feed line 62. Feed line 64 extends from joint 63 into the cylindrical elevation shaft. It further extends through hole 65 of shaft 31 and holes 66 of second rotating member 26 toward turntable 24. As shown in FIG. 6, feed line 64 is connected to rotary joint 67 which is mounted on azimuth shaft 25. Feed line 68 extends from joint 67 into the cylindrical shaft, and is connected to tested device 21.

Feed lines 62, 64 and 68 are covered by a plurality of rings 69 of ferrite or the like arranged at regular intervals. For the electromagnetic waves, therefore, those portions of the feed lines covered by the rings can be each regarded as a coil. In other words, each feed line, for the electromagnetic waves, can be considered to be equivalent to an alternate array of a plurality of conducting wires and a plurality of coils. The coils have high impedance for radio frequency electromagnetic waves. For the electromagnetic waves, therefore, the coils or those portions of the feed lines covered by the rings can be regarded as nonexisting. Accordingly, the feed lines, for the electromagnetic waves, can be considered to be formed only of a plurality of cut conducting wires, that is, to be nonexisting. As a result, the electromagnetic waves are prevented from being reflected or scattered by the feed lines. Thus, the electromagnetic field characteristics of the devices without a transmitter and the receiving antennas can be measured.

According to the present invention, moreover, turntable 24, second rotating member 26, support 34, the shafts, the belts, the pulleys, and screws (not shown) are formed of a nonmetallic material, such as FRP (fiber-reinforced plastic). In short, almost all components of the rotating device except drive units 41 and 42 are formed of the FRP. The relative magnetic permeability of the FRP is approximately 1. Thus, reflection and scattering of the electromagnetic waves emitted from tested device 21, which may be caused by the components of the rotating device, can be suppressed to some degree. However, the relative dielectric constant of these components is not 1. Since the nonmetallic material is a dielectric, it may sometimes influence the electromagnetic waves. For the electromagnetic waves, therefore, these components cannot be regarded as equivalent to air. Thus, the reflection and scattering of the electromagnetic waves by the components of the rotating device cannot be fully suppressed.

Thereupon, according to the present invention, a plurality of hollows 70, 71 and 72 are formed in turntable 24, second rotating member 26, and support 34, respectively. These hollows allow the electromagnetic waves from tested device 21 to pass through the components of the rotating device. Thus, the electromagnetic waves are less influenced by the nonmetallic material (dielectric) forming these components. As a result, these components can be regarded as equivalent to air for the electromagnetic waves.

Figure 7:
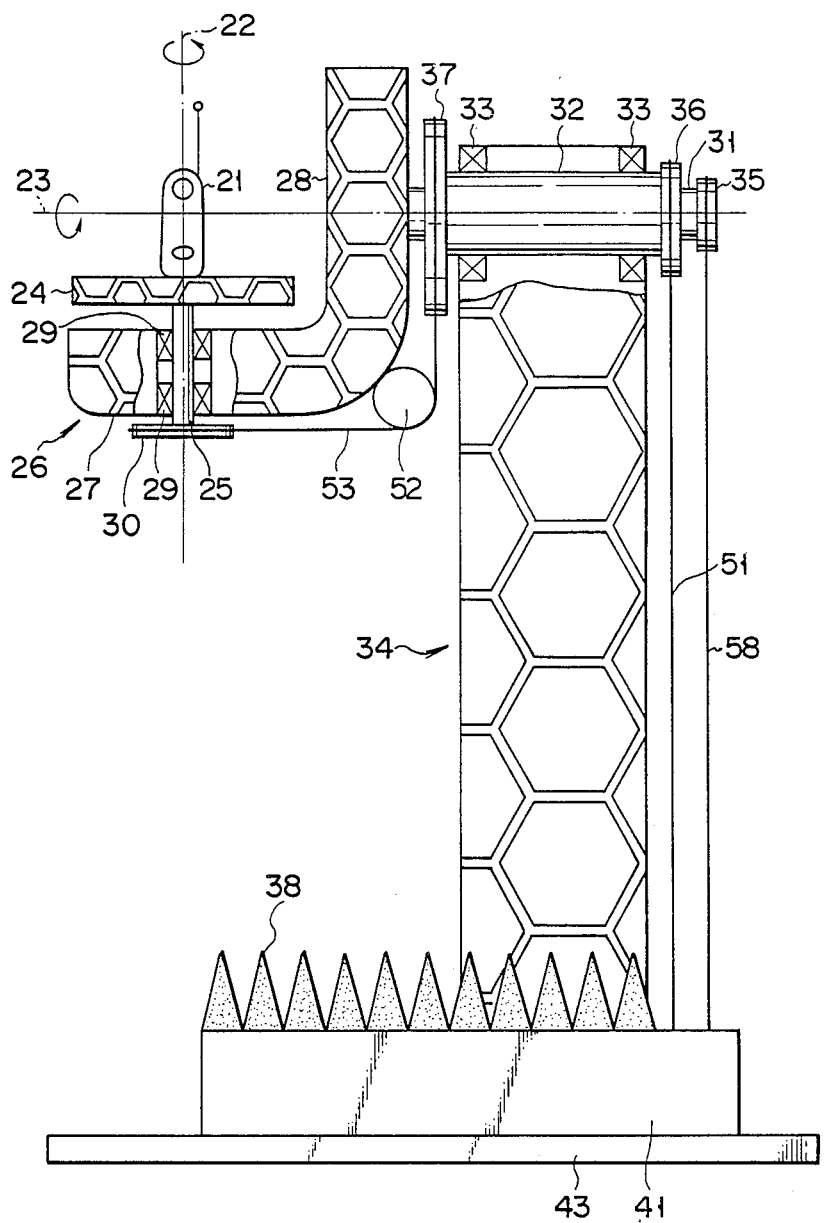
FIG. 7 is a front view of an apparatus for measuring radiation field characteristics according to a modification of the first embodiment.
Figure 7A:
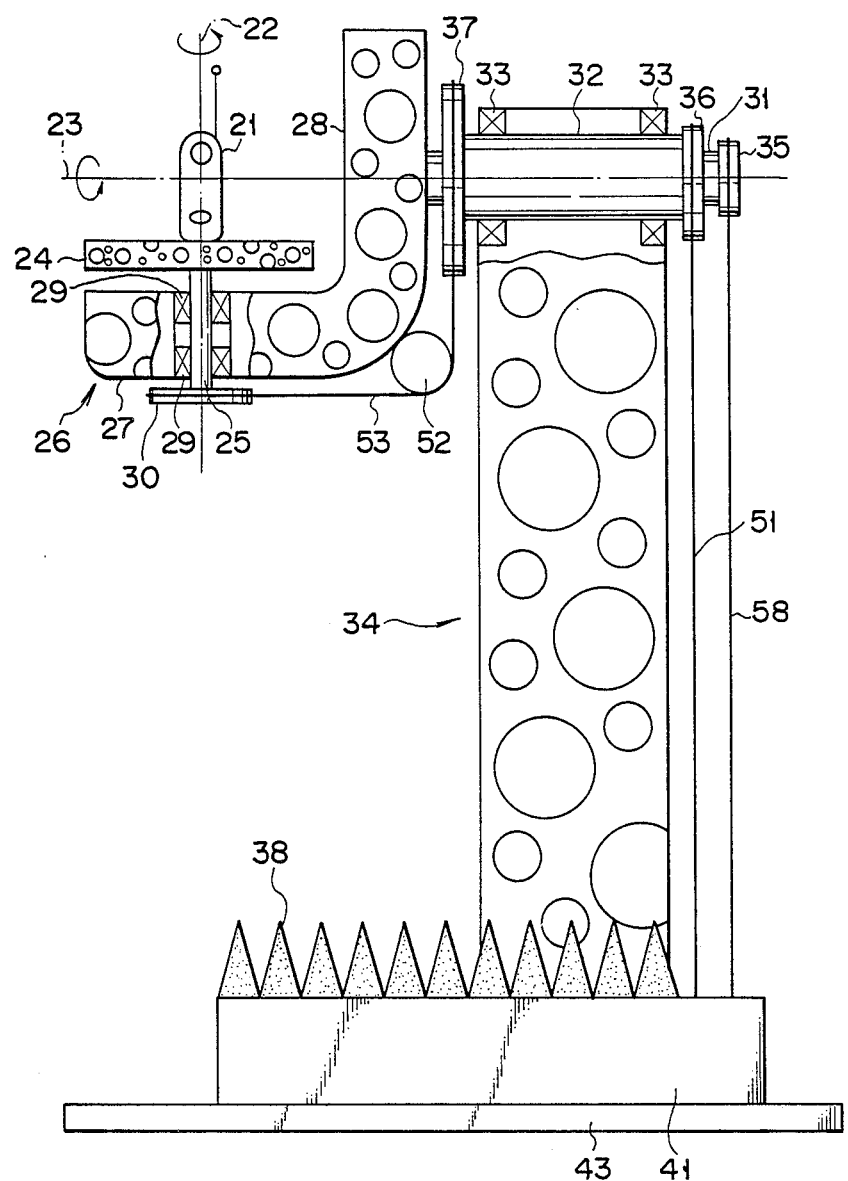
FIG. 7A is a front view of an apparatus for measuring radiation field characteristics according to another modification of the first embodiment.

The arrangement for suppressing the reflection and scattering is not limited to the hollows. If support 34 is formed of a plurality of rod members, for example, spaces may be defined within the support by the rod members. In this case, the spaces allow the electromagnetic waves to pass through the support, thereby suppressing the reflection and scattering of the waves. As shown in FIG. 7, moreover, turntable 24, second rotating member 26, and support 34 may be each formed of a honeycomb member. Also in this case, the honeycomb members allow the electromagnetic waves to pass through these components. As shown in FIG. 7A, furthermore, these components may be each formed of a foam member. Also in this case, the foam members allow the electromagnetic waves to pass through these components. Thus, according to the present invention, it is necessary only that these components be provided with spaces which allow the electromagnetic waves to pas through the components, thereby suppressing the reflection and scattering of the waves.

The following is a description of the reception/ measurement control device for the measuring apparatus and the measurement of radiation field characteristics.

As shown in FIG. 8, two driving signals are supplied from microcomputer 85 to azimuth motor 44 and elevation motor 46 through D/A converters 86 and 87. These signals are used to rotate tested device 21 around azimuth axis 22 and elevation axis 23. Also, a radio frequency signal is supplied from radio frequency signal source 61 to device 21 by means of a feed line. Thereupon, device 21 radiates electromagnetic waves while rotating around axes 22 and 23. Antenna 81 for horizontal polarization and antenna 82 for vertical polarization, which are disposed at predetermined distances from device 21, receive horizontal and vertical polarized electromagnetic waves, respectively. These polarized waves are supplied to network analyzer 83, which calculates the amplitude and phase of the electric field of each polarized wave. These calculated data are A/D-converted by means of A/D converter 84 and supplied to microcomputer 85.

Based on the angles of rotation of motors 44 and 46, azimuth encoder 45 and elevation encoder 47 detect the azimuth angle and elevation angle, respectively, of tested device 21, and the detected values are supplied to microcomputer 85. In this case, the azimuth angle is changed as device 21 is rotated around elevation axis 23, even though azimuth motor 44 is not rotating. Accordingly, the azimuth angle must be obtained by correcting the output value of azimuth encoder 45 in accordance with the elevation angle. Further, both the azimuth and elevation angles must be obtained by correcting the output values of encoders 45 and 47, in consideration of the power transmission ratio.

Microcomputer 85 calculates, for example, the electric field strengths of the two polarized waves, corresponding to the total solid angle, i.e., the azimuth and elevation angles. The calculated value is displayed on CRT 88 and recorded by digital video copy 89. Also, radiation power is obtained from the integral value of the field strengths for the total solid angle. Then, the ratio between the radiation power and input power supplied to tested device 21, that is, the radiation efficiency of the tested device, is calculated. If the phase difference between the electric fields of the two polarized waves is obtained corresponding to the total solid angle, polarization characteristics, such as the axial ratio, can be obtained.

Thus, the measuring apparatus of the present invention can measure various radiation field characteristics. According to the invention, moreover, almost all the components of the rotating device are formed of a nonmetallic material, and turntable 24 and support 34 are formed with hollows. In this arrangement, the hollows allow the electromagnetic waves to pass through these components. For the electromagnetic waves, therefore, these components can be regarded as equivalent to air. Accordingly, the reflection and scattering of the electromagnetic waves due to the presence of the components of the rotating device can be suppressed. Thus, the radiation field characteristics for the total solid angle can be accurately obtained even though the electromagnetic waves are within the VHF or UHF band. The accuracy of the obtained values of these field characteristics will be described later on the basis of the results of tests.

Since support 34 extends relatively long in the vertical direction, moreover, tested device 21 is kept at a relatively long distance from azimuth and elevation drive units 41 and 42. Therefore, the influence of the metallic parts can be reduced. Also, drive units 41 and 42 are covered by wave absorbers 38, so that the metallic parts can be further restrained from influencing the measured electromagnetic waves. Furthermore, the tested object can be prevented from being cut off from the receiving antenna.

In the conventional rotating device, an azimuth pedestal, which is a relatively bulky structure in the radial direction, is adapted to be rotated on the horizontal plane. In this first embodiment, on the other hand, turntable 24 is attached to the top portion of support 34, and drive units 41 and 42 are arranged at the bottom portion of the support. Thus, the rotating device of this embodiment is slimmer than the conventional one.

When applying the prior art rotating device to the measurement of electromagnetic waves within the VHF or UHF band, as mentioned before, the rotating device must be covered by a relatively tall wave absorber (about 1 meter high). According to the present embodiment, in contrast with this, there is no need of such a wave absorber, so that the rotating device may be made relatively short. Since the rotating mechanism need not be covered by a wave absorber, moreover, the electromagnetic waves can be measured in any regions.

Figure 9:
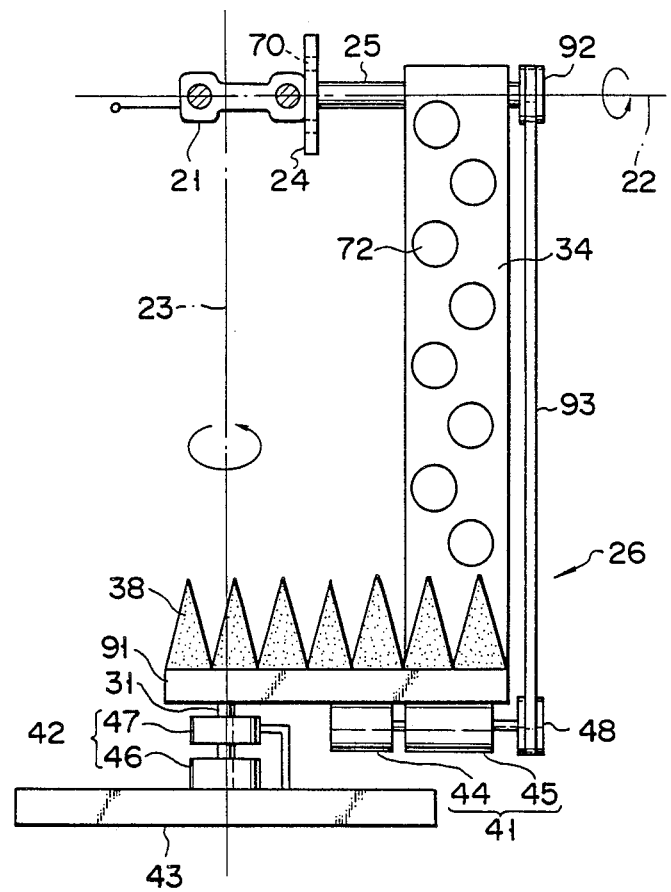
FIG. 9 is a front view of an apparatus for measuring radiation field characteristics according to a second embodiment of the present invention.

Referring now to FIG. 9, a second embodiment of the present invention will be described.

The second embodiment differs from the first embodiment in that support 34 is supported on second rotating member 26 when it is rotated. In this second embodiment, moreover, turntable 24 is located vertically, so that azimuth axis 22 and elevation axis 23 extend horizontally and vertically, respectively.

Elevation drive unit 42 is mounted on base 43. Second rotating member 26 is supported by means of elevation shaft 31 which extends from drive unit 42. Member 26 includes pedestal 91 fixed to shaft 31 and support 34 disposed on pedestal 91 so as to be eccentric to elevation axis 23. Azimuth shaft 25 is rotatably supported on the upper end of support 34. Vertical turntable 24 is fixed to the distal end of shaft 25. Azimuth drive unit 41 is mounted on the underside of pedestal 91. Timing belt 93 is passed around and between pulley 48 of drive unit 41 and pulley 92 mounted on the right-hand end of azimuth shaft 25. Radio wave absorber 38 on pedestal 91 covers both drive units 41 and 42.

In this arrangement, a rotatory force produced by azimuth drive unit 41 is transmitted to turntable 24 through pulley 48, belt 93, pulley 92, and azimuth shaft 25. Thus, turntable 24 is rotated around azimuth axis 22.

Meanwhile, elevation shaft 31 is rotated by means of a rotatory force produced by elevation drive unit 42, so that second rotating member 26 is rotated. Thereupon, turntable 24 is rotated around elevation axis 23. In other words, rotating member 26 of this embodiment also serves to transmit the rotatory force from elevation shaft 31 to turntable 24.

Also in this second embodiment, moreover, almost all the components of the rotating device, including turntable 24 and second rotating member 26, are formed of a nonmetallic material. Hollows 70 and 72 are formed in turntable 24 and support 34, respectively. Thus, also in the present embodiment, reflection and scattering of electromagnetic waves are suppressed, so that the radiation field characteristics for the total solid angle can be accurately measured.

Figure 10:
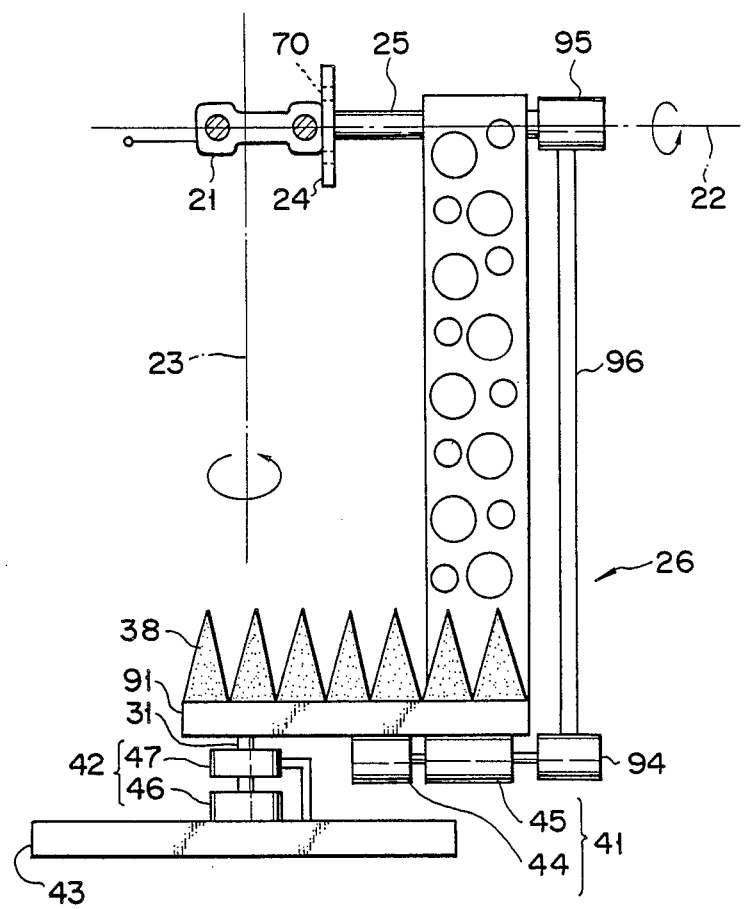
FIG. 10 is a front view of an apparatus for measuring radiation field characteristics according to a modification of the second embodiment.

Referring now to FIG. 10, a modification of the second embodiment will be described.

In this modification, gear unit 94 is mounted on the shaft of azimuth drive unit 41, while gear unit 95 is mounted on the right-hand end of azimuth shaft 25. These two gear units are coupled by means of propeller shaft 96. Thus, a rotatory force produced by azimuth drive unit 41 is transmitted to turntable 24 through gear unit 94, shaft 96, gear unit 95, and shaft 25. It is to be understood that shaft 96 and gear units 94 and 95 are formed of a nonmetallic material.

In this modification, moreover, support 34 is formed of a foam member having a number of pores. The pores of the foam member allow electromagnetic waves to pass through support 34, thereby suppressing reflection and scattering of the waves.

FIG. 11 shows optical means for supplying a radio frequency signal to tested device 21 according to the second embodiment.

Radio frequency signal source 61 and laser generator/modulator 101 for modulating laser from signal source 61 are mounted on the underside of pedestal 91 of a second rotating member. Laser beam 102 emitted from generator 101 is guided by means of mirrors (or prisms) 103 and 104 to azimuth shaft 25. Then, it passes through the cylindrical azimuth shaft and aperture 105 bored through turntable 24. Thereafter, beam 102 is projected on photoelectric transducer 106 in tested device 21, whereupon it is converted into an electrical signal, i.e., a radio frequency signal. This radio frequency signal is supplied to antenna 107, which radiates electromagnetic waves.

Thus, the radio frequency signal is transferred by the optical means. In contrast with the case in which electrical signals are supplied through conductor lines, therefore, radio waves are prevented from being scattered and reflected in wide band frequency range.

In the arrangement described above, the laser beam is guided from the laser generator to the photoelectric transducer by means of the mirrors. Alternatively, however, the beam may be guided from the generator to the transducer by means of an optical fiber.

FIG. 12 shows means for rotating the turntable by means of compressed air or gas.

Compressed air is supplied from compressor 110 through air pipe 111 to nozzle 112 at the distal end of the pipe. Thus, the compressed air is jetted from nozzle 112 to be blown against blades of air turbine 113. Thereupon, turbine 113 is rotated to rotate azimuth shaft 25, so that turntable 24 is rotated. It is to be understood that the air pipe is formed of a nonmetallic material. The turntable may also be rotated around an elevation axis by means of a similar mechanism.

Since the turntable is rotated by means of the compressed air in this manner, there is no need of electric motors which must inevitably be made of metal. Thus, the electromagnetic field characteristics can be measured further accurately.

Figure 13:
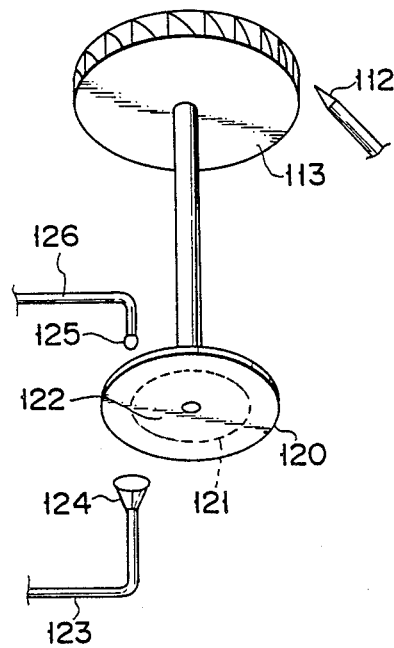
FIG. 13 is a perspective view of an optical angle detecting device.

In order to eliminate the use of metallic parts, however, the use of the encoders, as well as the electric motors, must be avoided. Thus, the azimuth and elevation angles cannot be detected. When rotating the turntable by means of compressed air, therefore, an optical angle detecting device, as shown in FIG. 13, is used for the angle detection. The following is a description of this detecting device.

Azimuth shaft 25 is fitted with disk 120 which constitutes an optical rotary encoder. Disk 120 has a number of orifices 121 for angle detection, arranged along the circumference thereof. Origin mark orifice 122 is formed at a suitable portion of the disk. Orifices 121 and 122 may be absolute orifices. A light beam emitted from input light fiber 123 passes through lens 124 to be incident on disk 120. After passing through orifices 121 and 122, the light beam is guided through receiving lens 125 to output light fiber 126. In the meantime, disk 120 is rotating. If the light beam is applied to orifices 121, therefore, it can pass through the orifices. If it is applied to any other portions than orifices 121, however, the beam is intercepted. Thus, the light beam serves as an optical pulse signal with the number of pulses corresponding to the azimuth angle. The optical pulse signal emitted from output light fiber 126 is delivered to a light sensor (not shown) to be converted thereby into an electrical pulse signal. The pulses of the electrical pulse signal are counted to obtain the azimuth angle. The elevation angle can be also detected by means of a similar angle detecting device attached to the elevation shaft.

In the first and second embodiments, the rotatory forces produced by the drive units are transmitted to the turntable through the pulleys and belts, so that backlash is caused. Therefore, the azimuth and elevation angles sometimes cannot be accurately detected. In contrast with this, the angle detecting device shown in FIG. 13, which cannot be subject to backlash, can detect the angles with high accuracy.

Figure 14:
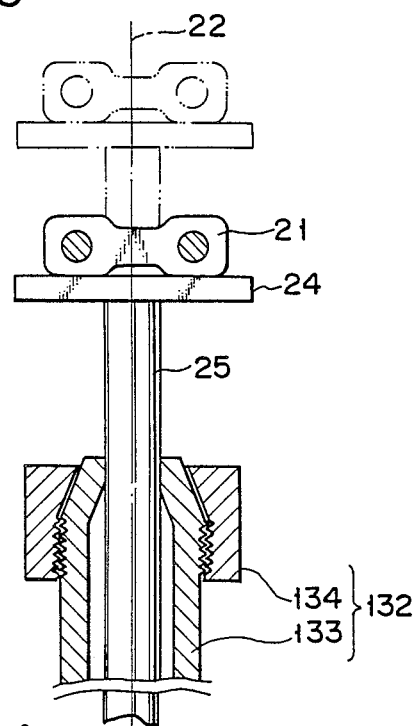
FIG. 14 is a front view of a turntable positioning device.

Referring now to FIGS. 14 to 16, a turntable positioning mechanism will be described.

If the intersection of azimuth and elevation axes 22 and 23 is coincident with the center of rotation of tested device 21, as shown in FIG. 15, device 21 is rotated around the axes without being deviated from the intersection. However, if the rotation center of device 21 is deviated from the intersection in the extending direction of the azimuth axis, shown in FIG. 16, device 21 is rotated along circular path 13 around the elevation axis. In this case, therefore, the measurement may be subject to errors. Thus, according to the present invention, the positioning mechanism for turntable 24 is used to situate the rotation center of tested device 21 on the intersection of the azimuth and elevation axes.

As shown in FIG. 14, the positioning mechanism is provided with device 132 which allows azimuth shaft 25 to move in the extending direction of azimuth axis 22, and also restricts the movement of shaft 25. Device 132 includes cylindrical member 133 for slidably supporting azimuth shaft 25 and adjusting member 134 screwed on member 133. A male screw is formed at the distal end portion of member 133, while a mating female screw is formed on member 134. Thus, when adjusting member 134 is rotated in a tightening direction, cylindrical member 133 presses azimuth shaft 25, thereby restraining shaft 25 from moving along the azimuth axis. When adjusting member 134 is rotated in a loosening direction, on the other hand, cylindrical member 133 allows azimuth shaft 25 to move along the azimuth axis. Thereupon, shaft 25 is slid along the azimuth axis. Thus, turntable 24, fixed to the distal end of azimuth shaft 25, is located in a desired position. The turntable is also positioned with respect to the direction of the elevation axis by means of a similar positioning mechanism.

The following is a description of the results of tests on the accuracy of the measurement of the radiation field characteristics, with respect to the total solid angle, by means of the radiation field characteristic measuring apparatuses according to the first and second embodiments. First, the results of the manufacture of an experimental apparatus and measurements using the same, based on the idea of the present invention, will be described to indicate the effect of the invention. This description will be followed by a description of a method for obtaining the evaluation index of the antenna best suited for the actual wave conditions.

First, terms to be used hereinafter will be defined.

Radiation efficiency $\eta a$ of the antenna is a scalar constant defined by the ratio between input power Pin applied to the antenna and radiation power Pr radiated from the antenna. In this case, it is supposed that the characteristics of the antenna cannot be changed by disturbance.

Gains of the antenna may be variously defined as follows:
Directive gain Gd,
Absolute gain Ga,
Actual gain Ge.

Directive gain Gd is a gain which is obtained when the radiation of the antenna is not otropic but directional.

Absolute gain Ga is a gain which is obtained in consideration of the radiation efficiency of the antenna when the matching of the antenna is adjusted perfectly.

Actual gain Ge is a gain which is obtained in consideration of the radiation efficiency and reflection loss of the antenna.

Thus, the gains of the antenna are scalar functions of the antenna direction which may be classified into three types. In general, the gain in the direction for the maximum value is sometimes called a gain without the definition with respect to the antenna direction.

In short, the radiation efficiency of the antenna is a constant which has no influence on the antenna direction, while the gain of the antenna is a function of the antenna direction. The radiation efficiency and the gain are greatly different in this regard. Radiation efficiency $\eta a$, directive gain Gd, absolute gain Ga, and actual gain Ge described above have the following correlations:

$$Ga(\theta, \phi) = Gd(\theta, \phi)\eta a,$$

$$Ge(\theta, \phi) = Ga(\theta, \phi)Lr,$$

where Lr is the reflection loss.

The inventor hereof conducted measurement tests on the radiation field characteristics for two cases. In one of these cases, almost all the components of the rotating device are formed of a nonmetallic material, and none of the components have any hollows. In the other case, turntable 24, second rotating member 26, and support 34 have hollows 70, 71 and 72, respectively. As a result, data were obtained as to how the hollows reduced the influence of the dielectric, constituting the components of the rotating device, on the measurement of the radiation field characteristics.

In these tests, the tested device used was a half-wavelength dipole antenna fitted with a miniature transmitter. The purpose of the tests was to examine the influence of the dielectric, for use as the material of the components of the rotating device, on the measurement of the radiation field characteristics. Accordingly, the electric field strengths (amplitudes) of horizontal and vertical polarized wave of electromagnetic waves radiated from the radio communication device were measured with respect to the total solid angle. The theoretical values of the amplitudes of the electric fields of the horizontal and vertical polarized waves, with respect to the total solid angle, had been obtained in advance. These theoretical values and the test values for the aforesaid two cases were compared.

The object of the present invention is to measure the radiation characteristics of a tested antenna with respect to the total solid angle thereof. Since the lower-limit frequency band to be measured, based on the frequency of the practically used radio communication devices, is the VHF band, it is necessary also to measure objects with relatively wide directivity. Accordingly, a radio wave absorber with a height of 1 m or more must be used to cover the rotating mechanism section to restrain reflection of radio waves thereby, if the mechanism section is made of metal, as in the case of the conventional measuring apparatus. Thus, the construction of the measuring apparatus is complicated. Moreover, the measurement must be made with respect to the total solid angle, so that the radio wave absorber, covering the metallic rotating mechanism section, should not be arranged so as to intercept the radio waves from the tested radio device. Therefore, the rotating mechanism section, which is used to support and rotate the tested object in all directions, should not be radioacoustically visible. In the present trial manufacture, the whole rotating mechanism section, including bearings and screws, was formed of nonmetallic materials. RULON (one kind of PTFE) and Delrin were used to form the bearings. FIG. 17C schematically shows the measuring apparatus. Motors and other metallic parts are located at the lowermost portion of the measuring apparatus which is distant enough from the rotating mechanism section, and are covered by means of a radio wave absorber. Power is transmitted to the rotating mechanism section by means of synchronous belts which use glass fibers as their reinforcement. A three-phase inverter motor of 200 V was used as a power source for varying the rotating speed. FRP was mainly used as a material for the rotating mechanism section. Since arm 26 of the rotating mechanism section cuts off the tested device from the receiving antenna, it may possibly influence the radiation characteristics of the tested object. A preparatory experiment was conducted to examine this influence.

Figure 17B:
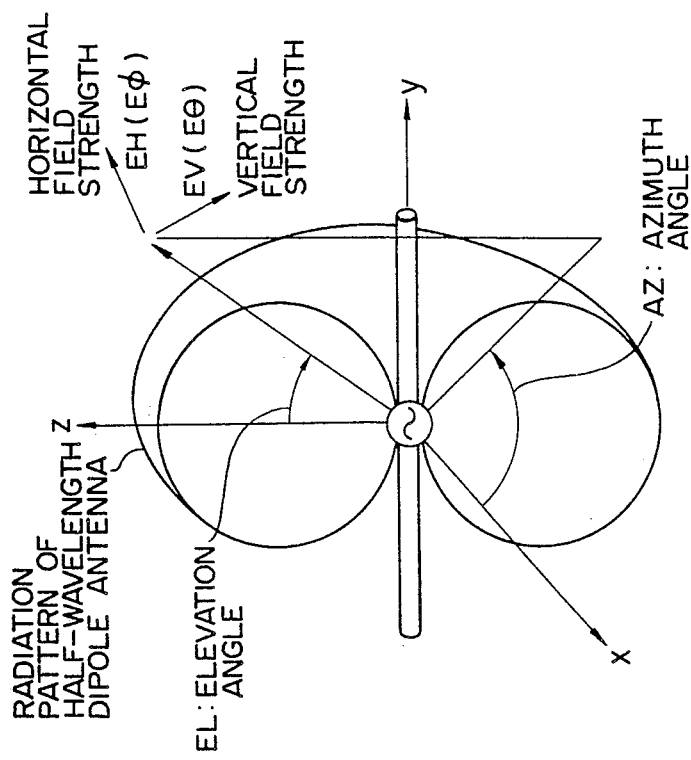
FIG. 17B shows a coordinate system of a half-wavelength dipole antenna.
Figure 17A:
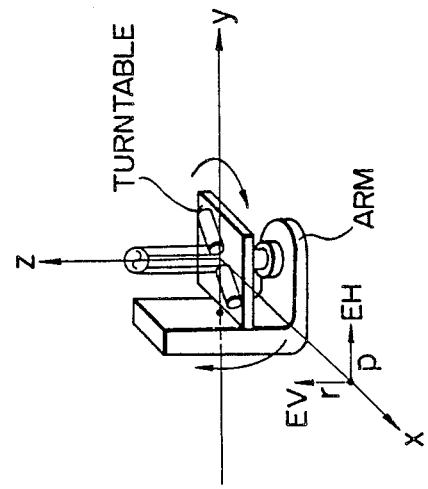
FIG. 17A is a partial perspective view of the rotating device, illustrating the way a half-wavelength dipole antenna is mounted on the turntable.

The following points were stressed as guidelines for the design of the rotating mechanism section for the preparatory experiment. The maximum rotational frequency of the azimuth axis was set to 120 rpm, in order to finish the measurement for the total solid angle within one minute, as a mechanical target. The amplitude of vibration of the tested object was limited to 5 mm where the diameter and weight of the object were 60 cm and 2 kg, respectively. The turbulence of the directivity caused by the measuring apparatus, among other electrical characteristics, must be defined. The measuring frequency band and the size of the tested object indicated that the directivity gain of the object was not very high. Accordingly, the ripple of the H plane of the half-wavelength dipole antenna was intended to be restricted to 1 dB as an electrical target value of the rotating mechanism section. Theoretical values of the directivity of the half-wavelength dipole antenna will be surveyed for comparison to see if the radiation characteristics are accurately measured with respect to the total solid angle. FIGS. 17A and 17B show the half-wavelength wavelength dipole antenna on the turntable and a coordinate system which is used to deduce the theoretical values. Let it be supposed that the electric field strengths of the horizontal and vertical polarized waves at a reception point corresponding to azimuth angle $\phi$ and elevation angle $\theta$ are $E_H$ and $E_V$, respectively. If the directivity of the half-wavelength dipole antenna is subjected to transformation of coordinate system, $E_H$ and $E_V$ are given as follows:

$$E_H(\theta, \phi) = \cos\left(\frac{\pi}{2}\sin\phi\sin\theta\right)\cos\phi/(1 - \sin^2\phi\sin^2\theta)$$

$$E_V(\theta, \phi) = \cos\left(\frac{\pi}{2}\sin\phi\sin\theta\right)\sin\phi\cos\theta/(1 - \sin^2\phi\sin^2\theta)$$

Figure 18A:
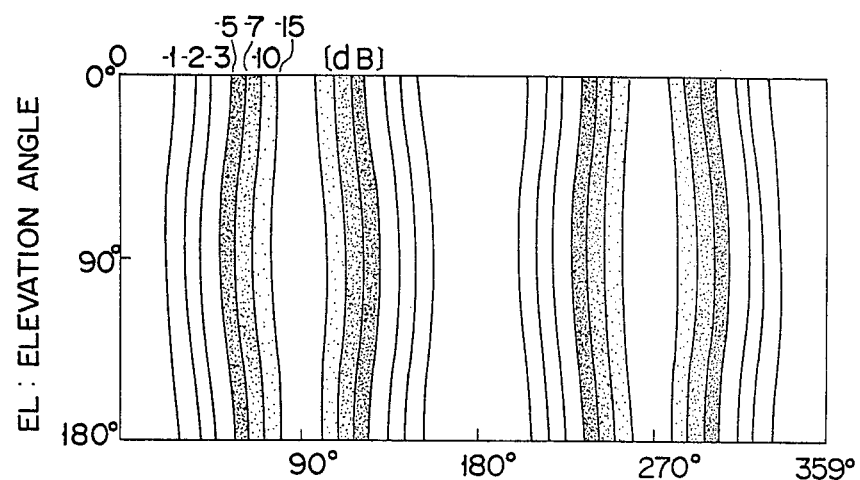
FIG. 18A and 18B show theoretical values of electric field strength distribution with respect to the total solid angle of the half-wavelength dipole antenna.
Figure 18B:
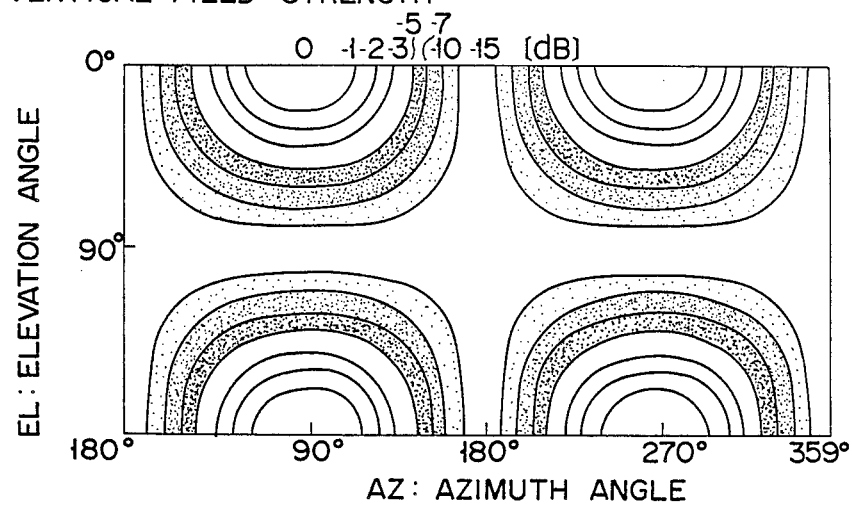

FIG. 18 shows the results of these calculations. The data in FIG. 18 can be easily read if the drawing is supposed to be a Mercator chart. The axes of abscissa and ordinate of FIG. 18 correspond to the azimuth and elevation angles, respectively. A standard half-wavelength dipole antenna was used for the measurement, and was mounted on the turntable in the manner shown in FIG. 17A. In this arrangement, arm 26 under the turntable intercepts the radio waves at the elevation angle of about 180°. The influence of this situation was measured to evaluate the rotating mechanism section. An SAW oscillation module with a built-in battery was manufactured and used as an oscillator, by way of trial. A phase-locked loop (PLL) control was not used. Therefore this oscillator was in a free running mode. A 6-dB attenuator was inserted into the output of the oscillator lest the output be changed by variation of load. By doing this, a return loss of 12 dB can be secured at worst. In this measurement, the measured value of VSWR, as viewed from an N-shaped contact jack of the standard half-wavelength dipole antenna, was 1.7. The module measured 28 mm×50 mm×65 mm.

Figure 20:
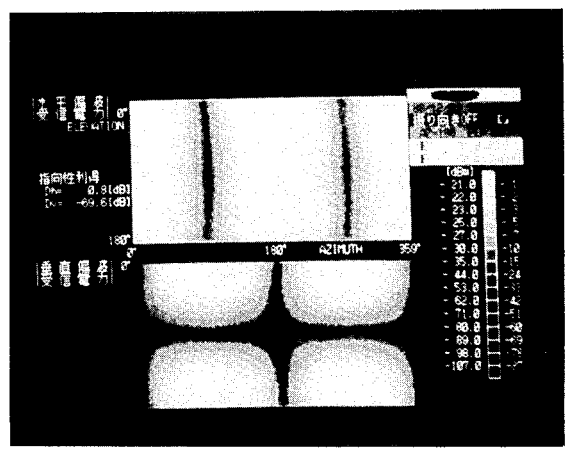
FIG. 20 is a photograph prepared by digital video copying, showing test values of electric field strength distribution with respect to the total solid angle of the half-wave dipole antenna, obtained with use of the rotating device according to the first embodiment.
Figure 21:
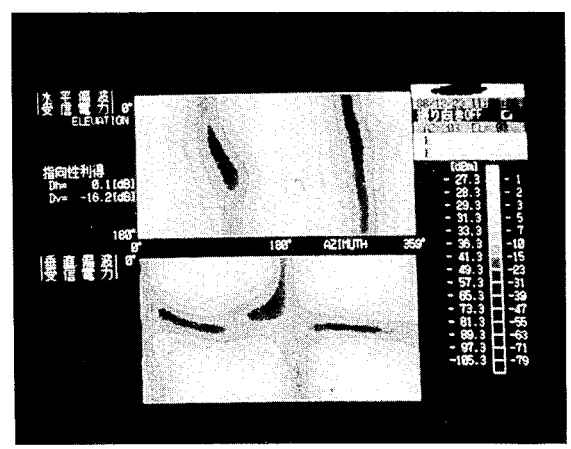
FIG. 21 is a photograph prepared by digital video copying, showing test values of electric field strength distribution with respect to the total solid angle of the half-wave length dipole antenna, obtained with use of a rotating device formed of nonmetallic components without hollows.

The measurement in the preparatory experiment was conducted using a frequency band of 250 MHz. One log periodic antenna was used as the receiving antenna. The horizontal and vertical polarized waves were measured in two times by rotating the log period antenna. FIG. 21 shows the results of these measurements. The measurement of the two polarized waves can be finished at a time by using a high-speed coaxial switch and an antenna which can receive two polarized waves crossing at right angles to each other. The results shown in FIG. 21 represent test values for the case in which almost all the components of the rotating device are formed of a nonmetallic material, and none of the components have any hollows. The test value for the dielectric of the rotating device is substantially different from the theoretical value, thus indicating the influence of the dielectric arm. It is difficult theoretically to analyze the electrical characteristics, including the construction of the arm portion. In this test, therefore, the arm portion was improved experimentally. More specifically, the arm portion was hollowed to obtain the desired electrical characteristics. FIG. 20 shows measurement results obtained after the hollowing process. The results shown in FIG. 20 represent test values (first embodiments) for the case in which almost all the components of the rotating device are formed of a nonmetallic material, and turntable 24, second rotating member 26, and support 34 have hollows 70, 71 and 72, respectively. The motors, for use as the power sources, and the rotary encoders are located at the lowermost portion of the mechanism section. In this arrangement, if the elevation shaft is rotated, the azimuth shaft (turn-table) also rotates even though the azimuth motor is stopped. Namely, the azimuth angle of the turntable is a function of the elevation angle. In this apparatus, therefore, the azimuth angle is corrected with use of the elevation angle as data. Since this operation must be performed at high speed, a correcting circuit, which is formed from independent hardware, is incorporated in the rotating mechanism section. If the tested object has an oscillation source, the measurement may be made with use of radio waves radiated from the radio device. In evaluating a built-in antenna of a receiver, however, radio frequency power must be supplied to the tested object by a suitable method.

To this end, the azimuth and elevation shafts of the measuring apparatus are each formed into a hollow cylinder in which a coaxial cable for radio frequency power supply can be disposed. The coaxial cables cause radio waves to scatter, thereby influencing the measurement results. The coaxial cable is covered by a toroidal ferrite member to reduce this effect. This measuring apparatus is composed of three major parts; the rotating mechanism section, a rotation control data processing section, and software.

The radiation characteristics, including the phase, of rectangularly crossing polarized waves from the tested object are measured by means of the measuring apparatus of the present invention, and are stored in a memory of a computer. Thereupon, all the data on the field radiation characteristics of the tested object are considered to have been stored. If necessary, any desired characteristics, such as the radiation characteristics for any polarized waves, can be obtained by processing the measured data. Software must be developed in order to effect smooth measurements and high-speed, high-accuracy measurement data processing by means of the apparatus of the invention. In particular, it is essential to develop software which is adapted for calibration for high-accuracy measurement and graphic processing for efficient analysis of measurement results. Therefore, the software of this type has been actually developed. It permits dialogue-type control using a mouse for higher-efficiency measurement. Interpolation and integration of measured data can be accomplished within one minute. Further, the measurement results can be displayed on azimuth and elevation planes by mapping (see FIG. 19) in about 5 seconds. The mouse enables the display of received power in any direction ($\phi$, $\theta$) and of any cut pattern. It is also possible to integrate the radiation power, thereby obtaining the radiation efficiency, and to obtain the directivity gain at a cursor point on the map. Furthermore, the whole measurement system, including a radio wave anechoic chamber, can be checked as required, using the Friis transmission propagation formula. Generally, the polarized waves from the tested object are elliptically polarized waves. The map display has a special polarization characteristic display function for a visual understanding of the polarization characteristic. By this function, the polarization characteristic at the mouse cursor point on the map is indicated by an ellipse, and the polarization factor and the axial ratio are displayed numerically. The apparatus also has an automatic turning function to redirect the mouse cursor point in the map display toward the receiving antenna. This facilitates an understanding of the radiation mechanism, of the test antenna, by observing the test antenna from the point of the receiving antenna. The function of the software is represented in Table 1.

To measure the phase of the radiation electromagnetic field of the tested object, a network analyzer must be employed as a receiver as is shown in FIG. 8. In this instance, a spectrum analyzer was used to determine the influence of the dielectric member on the radiation characteristic of the object.

Figure 21A:
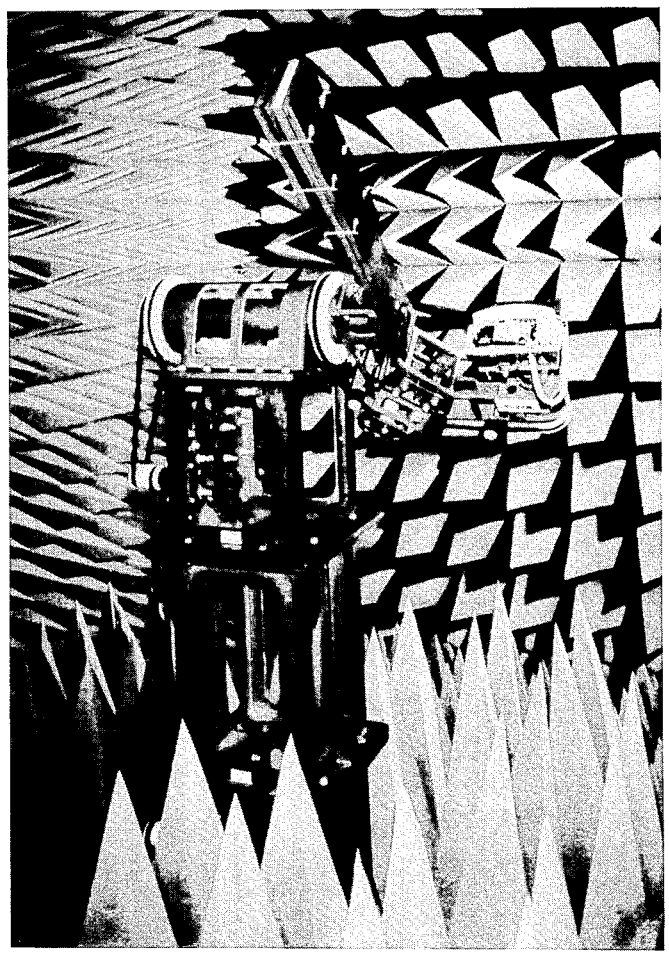
FIGS. 21A and 21B show an arrangement by which a high precision measurement is calibrated.
Figure 21A:
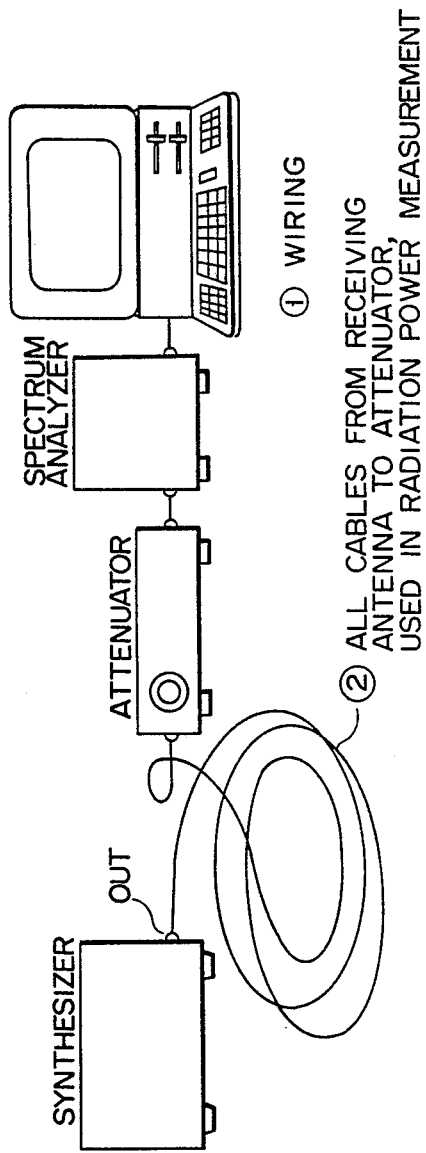
Figure 21B:
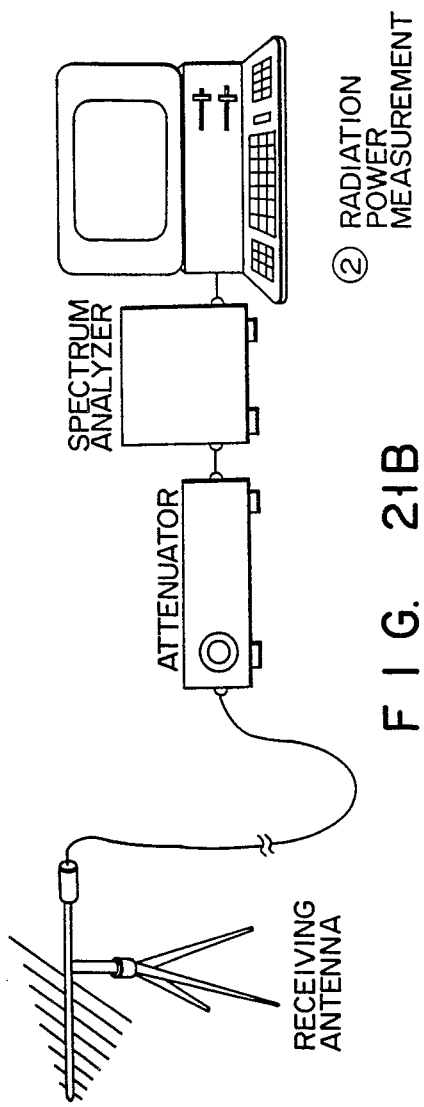

The calibration required for a high-precision measurement will now be explained. For a successful calibration, the absolute level is secured by means of a power meter (i.e., ML83A manufactured by Anritsu Co.), and the relative level is ensured by means of a standard attenuator (i.e., model ,355D manufactured by HP). FIGS. 21A and 21B illustrate the setting for performing this calibration. The power meter to be used in the calibration has traceability with the primary standard installed in the electrical test center via the standard set in the research center.

First, the power meter is operated, thereby adjusting the level of the synthesizer at, for example, −20 dB. The receiving antenna is connected to the coaxial cable. Then, the cable is connected to the standard attenuator. Next, the attenuator is coupled to the spectrum analyzer. Thereafter, the receiving antenna and the coaxial cable are disconnected from each other, and the connector of the coaxial cable is connected to the output of the synthesizer. See FIG. 21A. Hereinafter, the connector of the coaxial cable will be regarded as the input terminal of the receiver.

According to the calibration software, the attenuation degree of the standard attenuator is changed from 0 dB to −90 dB, step by step, each time by 5 dB, and the detected output of the spectrum analyzer is fetched via a 12-bit A/D converter. GPIB cannot be used since this data must be acquired at high speed. A calibration table based on the data is prepared within the computer. The table is formulated such that the received power can be immediately supplied by indirectly addressing the table, using the data output from the A/D converter, in order to accomplish high-speed data acquisition. After the calibration table has been prepared, the attenuation degree of the standard attenuator is changed again, from 0 dB to −90 dB, thereby checking the operation of the receiving system. Thus, the calibration for the receiving system is completed. The operating precision of the receiving system as a whole is maintained at 0.3 dB or less. When no calibration is performed on the spectrum analyzer, the absolute level of the analyzer cannot be measured with sufficient accuracy. To measure the phase as well, a reference phase should be set. For this purpose, use is made of an auxiliary receiving antenna.

The radio wave anecoic chamber, in which the radiation characteristics of the tested object was measured, will now be described.

This chamber was 8.7 m×7.4 m×7.6 m. To improve the characteristic to the VHF band, an absorber made of ferrite was secured to the bottom of the pyramidal absorber. By virtue of the height of the measuring apparatus, the object to be tested was located 1.5 m below the center of the quiet zone of the anecoic chamber.

Figure 21C:
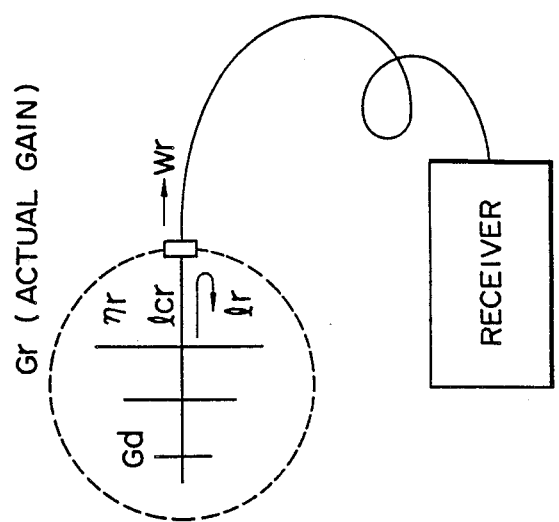
FIG. 21C is a diagram illustrating the principle of radiation efficiency measurement.
Figure 21C:
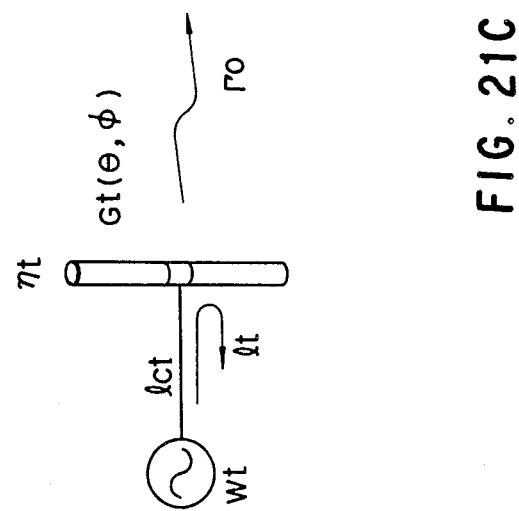

It will now be discussed how to derive the radiation efficiency. FIG. 21C shows the principle of measuring the radiation efficiency. When the object is orientated in the direction of ($\theta$, $\phi$), the receiving antenna having an actual gain Gr receives horizontal polarized waves of power $W_{rh}(\theta, \phi)$ and vertical polarized waves of power $W_{rv}(\theta, \phi)$. In this case, the power density P ($\theta$, $\phi$) is given:

$$P(\theta, \phi) = \frac{4\pi}{\lambda^2 Gr} \{W_{rh}(\theta, \phi) + W_{rv}(\theta, \phi)\}$$

Hence, the radiation power Pr is:

$$Pr = \frac{4\pi}{\lambda^2 Gr} \int_0^{2\pi} \int_0^{\pi} \{W_{rh}(\theta, \phi) + W_{rv}(\theta, \phi)\} r^2 \sin\theta d\theta d\phi$$

where r is the distance between the object and the receiving antenna. The radiation efficiency $\eta t$ of the tested antenna is represented as follows:

$$\eta t = Pr/(W_t l_{ct} l_t)$$

where $W_t$ is the power supplied to the tested antenna, $l_{ct}$ is the cable loss between the tested antenna and the power supply cable, and $l_t$ is the reflection loss of the tested antenna.

Figure 21D:
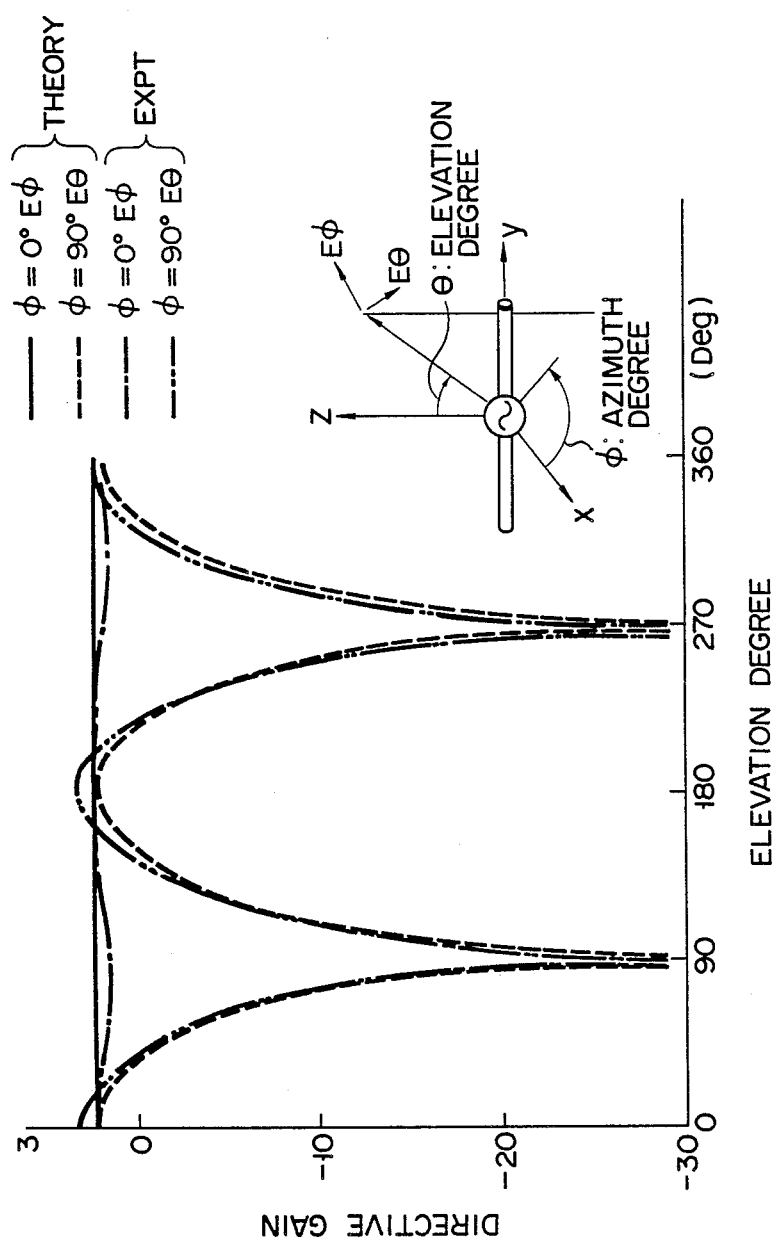
FIG. 21D is a graph showing directivity gains measured by means of the radiation field characteristic measuring apparatus according to the present invention.

For purposes of readily understanding FIG. 21C the following abbreviations are defined:
 wt: power supplied to tested antenna
 lct: cable loss between tested antenna and supplied power
 lt: reflection loss of tested antenna
 Gt ($\theta,\phi$): directive gain of tested antenna
 Gr: actual gain of receiving antenna
 Gd: directive gain of receiving antenna
 $\eta$r: radiation efficiency of receiving antenna
 lcr: cable loss between receiving antenna and feeding point
 $\eta$t: radiation efficiency of tested antenna
 lr: reflection loss of receiving antenna
 $\Gamma$o: propagation loss of free space Two log-periodic antennas (200 MHz to 1 GHz) were used, one as the receiving antenna, and the other as the receiving antenna. These antennas were opposed to each other, in the radio wave anecoic chamber. The distance between the antennas was varied, and the polarization were changed vertical and horizontal, thereby determining how the transmission loss varies depending on the distance and the type of polarized waves. Since the absorption characteristic of a radio wave anecoic chamber is not perfect, the maximum level-difference of 1 dB was observed between the horizontal polarized waves and the vertical polarized waves, when the distance between the antennas was left unchanged. Therefore, the valves of the actual gain of the receiving antenna calculated in accordance with Friis transmission formula are not the same. Here, the average of the gain, i.e., 4.9 dBi, was regarded as the actual gain of the receiving antenna. Further, the accuracy of measuring the directivity of the H plane of a half-wavelength dipole was used as a criterion of evaluating the rotary mechanism. The results of the measurements were integrated, thus finding the radiation power. From the radiation power, the directive gain was calculated. The directive gain, thus calculated, is shown in FIG. 21D. The region defining $\theta$ in the spherical coordinates ranges 0 to $\pi$. Nonetheless, in FIG. 21D, this region is extended, and the directive gain is plotted on the axis of the abscissa. As is evident from FIG. 21D, the theoretical value and the experimental value are similar. In particular, they are quite approximate to each other toward the low level of −30 dB. FIG. 21E is a map showing the theoretical value and the value measured by means of a quartz-crystal oscillator module. The ripple on the H plane was 1 dB or less. Also for the conventional single-axis positioner. wherein the measuring device does not intercept the electric waves reflected from the object, it is difficult to detect the ripple on the H plane to 1 dB or less, due to the influence of the absorption characteristic of the radio wave anecoic chamber and insufficient balun of the standard antenna. In view of this, the directive gain, measured by the above method, was satisfactory.

The return loss of the half-wavelength dipole antenna was measured for one case where a radiation element was attached to the antenna, and for another case where no radiation elements were attached to the antenna. The results were: the internal cable loss was 0.2 dB, and the reflection loss at the feed point was 0.4 dB. From these values the radiation efficiency of the half-wavelength dipole antenna was calculated, the results being shown in Table 2. This method of the radiation efficiency is absolute measurement. A measuring error may result from the balun of the half-wavelength dipole antenna, the effects of the rotary mechanism of the apparatus set and the inperfection of the absorption characteristic of the radio wave anecoic chamber. Nonetheless, the values can be far more accurate than those values obtained by the conventional method of measuring the radiation efficiency of small-sized antennas.

When the measuring apparatus is invisible in terms of radio waves and is perfect, the radiation directivity of the antenna must remain unchanged, in whichever direction the antenna is mounted on the turntable. To make sure of this, the radiation characteristic of the radio apparatus to be tested was measured. This measuring was carried out, partly in the radio wave anecoic chamber built in the research center. The dimensions of the radio wave anechoic chamber is 4.8 m×4.8 m×12 m. In order to improve the characteristic for the VHF band, a radio wave absorber 120 cm high was located in the secular area. Use was made of a quartz crystal oscillator which had better frequency stability and better output stability than the oscillator used in the preliminary experiment. The size of the module made for the experiment is 28 mm×32 mm×55 mm. The output fluctuation was 0.5 dB or less with respect to the load fluctuation in VSWR 2. The frequency stability was 10 ppm. In the measuring process, an attenuator of 10 dB was used, and a return loss of 20 dB can be secured in the worst case. In this case, the output fluctuation was 0.2 dB or less. The angle at which the tested object was attached to the turntable was varied, and the radiation efficiency was measured. (In this measurement, the reflection loss was regarded as 0DB, though actually not 0 dB.) The results are shown in Table 3. In Table 3, the mark "—" represents the angle at which the measuring was not performed. The frequencies used in the measuring were of 250 MHz band and 380 MHz band. However said angle was changed, the measured radiation efficiency varied by only 0.8 dB at most. FIG. 21F is a map showing the results of measuring carried out on the radio apparatus. As is evident from this figure, when the mounting angle was changed, the measured values changed greatly. Nontheless, the difference between the integrated radiation powers was 0.3 dB. In view of these results, the present apparatus can be said to be advantageous.

Since the radio wave anecoic chamber used in the measuring had not sufficient absorption characteristic, it would not be reasonable to regard the dielectric body used in the apparatus as the sole cause of the changes in the integrated power which occur in accordance with the angle at which the object is attached. To evaluate the measuring accuracy of the present apparatus correctly, it is necessary to employ a radio wave anecoic chamber whose absorption characteristic is −40 dB or more. The present apparatus is believed to have fully achieved its objective, i.e., to measure the radiation characteristic of an object, which is of VUHF band and has relatively broad radiation beam, at total solid angles at high speed.

Based on these experimental results, FIG. 20 shows test values (first embodiment) for the case in which almost all the components of the rotating device are formed of a nonmetallic material, and turntable 24, second rotating member 26, and support 34 have hollows 70, 71 and 72, respectively. These test values agree well with the theoretical values of Figs. 18 and 19. For the electromagnetic waves, in this case, the components of the rotating device are regarded as substantially equivalent to air.

On the other hand, FIG. 21 shows test values for the case in which almost all the components of the rotating device are formed of a nonmetallic material, and none of the components have any hollows. It may be understood that in this case, as compared to the case of FIG. 20, the dielectric of the rotating device greatly influences the measurement of the radiation field characteristics. In other words, the physical properties of the rotating device, in this case, are hardly the same as those of air.

As seen from a comparison between FIGS. 20 and 21, the influence of the dielectric of the rotating device on the measurement of the radiation field characteristics is considerably reduced in the first embodiment. Thus, it is evident that the reflection and scattering of the electromagnetic waves due to the presence of the components of the rotating device can be considerably suppressed. In consequence, according to the present invention, the radiation field characteristics with respect to the total solid angle can be accurately measured.

In order to obtain the radiation power and radiation efficiency of the antenna, as described above, the radiation power with respect to the total solid angle of the tested antenna must be measured. Conventionally, however, the radiation field characteristics with respect to the total solid angle cannot be accurately obtained. Actually, therefore, it has hitherto been difficult to measure the radiation power of a substantially nondirectional antenna, with respect to the total solid angle thereof.

According to the measuring apparatus of the present invention, however, the radiation field characteristics with respect to the total solid angle can be accurately obtained. Therefore, the radiation power of a substantially isotropic antenna, with respect to the total solid angle thereof, can be accurately measured.

In consideration of the absorption characteristic (maximum level difference between horizontal and vertical polarized waves is 1 dB) of the radio anechoic chamber, the test values shown in FIG. 20 can be regarded as fully consistent with the theoretical values.

Thus, the radiation field characteristics with respect to the total solid angle can be highly accurately obtained by means of the measuring apparatus according to the present invention. In consequence, the radiation power of the substantially isotropic antenna, with respect to the total solid angle thereof, can be accurately measured.

The following is a description of the method for obtaining the evaluation index of the antenna best suited for the actual radio conditions, according to a third embodiment of the present invention.

First, what should be used as the evaluation index of the antenna will be described. The evaluation is related to the arrival direction (or arrival angle) of radio waves and the directivity of the antenna. There are two cases as follows:

(1) The arrival direction of radio waves is random, and the polarized waves vary at random, or the working direction of the antenna is random (akin to working condition of a cordless telephone).

In this case, the radiation efficiency is suitably used as the evaluation index of the antenna.

(2) The arrival direction of radio waves, the polarized waves, and the working direction of the antenna are fixed or regular (corresponding to the working condition of an antenna for communication between fixed stations).

In this case, the maximum gain in the radiation direction of the desired polarization used is suitably used as the evaluation index of the antenna. This is reasonable only if the received power is expected to be increased, and the suppression of side lobes and other problems should be considered separately.

Thus, the evaluation index of the antenna must be selected among various factors depending on the arrival direction of radio waves, the polarized waves, and the setting direction of the antenna. In other words, a correct evaluation index should be used to evaluate the antenna with high accuracy.

Conventionally, there is an idea which uses the radiation efficiency as the evaluation index of an antenna, e.g., an antenna for a car telephone, of which the setting direction is fixed, and the wave arrival probability is not uniform with respect to the total solid angle.

However, the conventional radiation field characteristic measuring apparatus cannot accurately measure the whole radiation field characteristics of the tested antenna with respect to the total solid angle thereof. Thus, the radiation power with respect to the total solid angle of the tested antenna cannot be obtained. For an antenna for a car telephone and the like, therefore, radiation field characteristics with respect to a specific cut pattern are measured, and the mean gain is obtained from the pattern of the cut pattern. In consequence, the mean gain thus obtained is used as the evaluation index of the car telephone antenna.

According to the method described above, the evaluation index is obtained on the assumption that the arrival angle of the radio waves is fixed. In other words, no consideration is given to the actual condition that the wave arrival angle is distributed on the basis of probability. Accordingly, the mean gain obtained in the aforesaid manner is unfit for use as the evaluation index of the car telephone antenna and the like.

Conventionally, therefore, the radiation field characteristics with respect to the total solid angle cannot be accurately measured, so that it is impossible to obtain the antenna evaluation index best suited for the actual radio conditions.

Accordingly, the third embodiment of the present invention is intended to obtain the antenna evaluation index best suited for the actual radio conditions, by using the radiation field characteristic measuring apparatus according to the first or second embodiment Thus, with use of the measuring apparatus according to the first or second embodiment, the radiation field characteristics of the tested antenna with respect to the total solid angle thereof can be accurately measured. Accordingly, the radiation power of the tested antenna with respect to the total solid angle can be accurately measured Thereupon, in the third embodiment, the effective radiation power is obtained with use of the accurately measured data and the arrival probability density function of the radio waves as a weighting function. Thus, the antenna evaluation index suited for the actual radio conditions can be obtained First, there will be described the way of the effective radiation power is obtained with use of the wave arrival probability density function as the weighting function, in the measuring apparatus according to the first or second embodiment.

The following is a description of the case in which weighting function W ($\theta$, $\phi$) is constant, that is, the radio waves arrive with the same probability from all directions. In this case, the radiation efficiency of the antenna can be obtained if the XPD is 0 dB.

Figure 22:
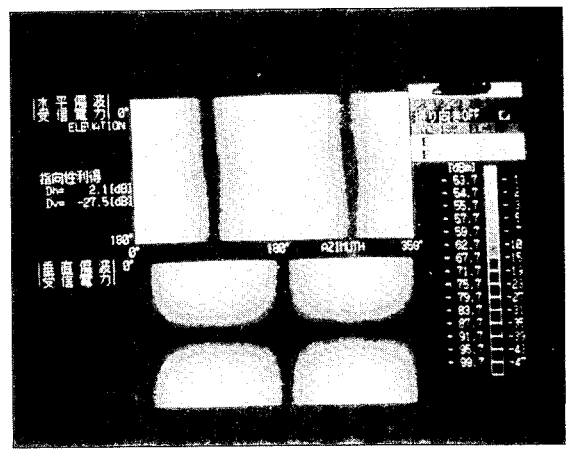
FIG. 22 is a photograph prepared by digital video copying, showing measurement results of radiation field characteristics obtained when the half-wave length dipole antenna is mounted horizontally on the turntable.
Figure 23:
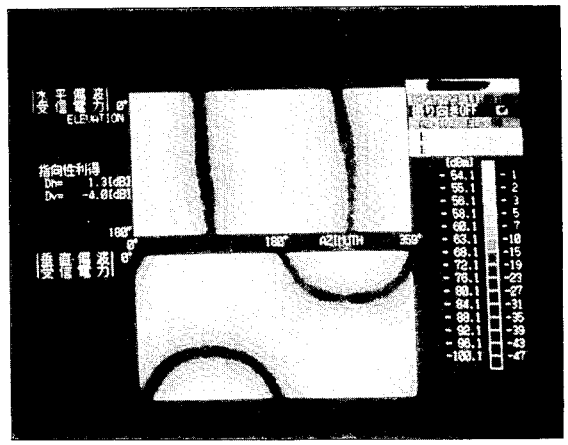
FIG. 23 is a photograph prepared by digital video copying, showing measurement results of radiation field characteristics obtained when the half-wave length dipole antenna is mounted at an angle of 40° to a horizontal plane, on the turntable.

A tested antenna, a half-wavelength dipole antenna having a known radiation efficiency and fitted with a miniature oscillator, was set horizontally on the turntable, and the radiation field characteristics of the antenna were measured. The radiation efficiency can be obtained by integrating measured values of the horizontal and vertical polarized waves. FIG. 22 shows the results of the measurement. The result of the integration was 0.8 dBm. Based on this integration result, transmission power of −2.9 dBm, and receiving antenna gain of 4.9 dBi, the effective radiation efficiency of the tested antenna obtained was −1.2 dB.

This result involves the reflection loss and internal Cable loss of the tested antenna at 0.5 dB. Therefore, the radiation efficiency of the single half-wavelength dipole antenna was −0.7 dB. This measurement is an absolute measurement of the radiation efficiency, ensuring a high accuracy that cannot be attained by the conventional measurement method.

In order to check to see if the measurement result of the radiation efficiency does not vary depending on the setting direction of the antenna, moreover, the same measurement was conducted in a manner such that the tested antenna on the turntable was inclined at an angle of 40° to a horizontal plane. Although the distribution pattern of the received power was different from that obtained for the case of FIG. 22 in which the tilt angle is 0°, the difference between the integration results was small (0.3 dB). Measurement errors may be caused by the radio anechoic chamber, the rotating device of the measuring apparatus, the balun of the half-wavelength dipole antenna, and the oscillator. The measurement accuracy, however, is higher than that obtained by the conventional method of radiation efficiency measurement for small built-in.

The following a description of a method for obtaining the effective radiation power when the arrival angle of radio waves is not fixed. The antenna used in this case is an antenna for a car telephone. In general, car antennas should preferably have an omnidirectional characteristic with respect to the horizontal direction, since the relative positions of a base station and a mobile station are not fixed.

Thus, the arrival angle of radio waves has a uniform probability with respect to azimuth angle $\phi$ (azimuth direction). With respect to elevation angle $\theta$ (elevation direction), on the other hand, the arrival probability for the horizontal direction is naturally higher than the probability of arrival from the direction of the zenith. Reportedly, the arrival angle is concentrated between 0° and 30° in terms of elevation. In the description to follow, powers of sin$\theta$ are used as weighting functions having such an arrival probability.

Figure 24:
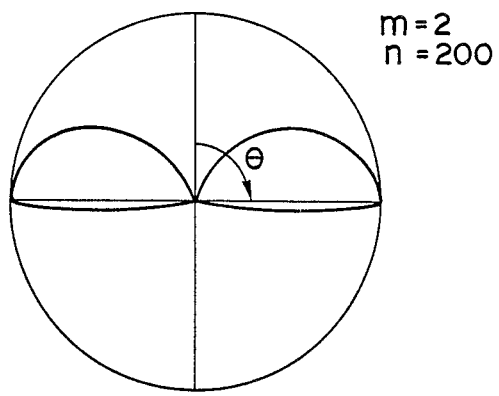
FIG. 24 is a diagram showing a weighting function having distribution mainly above the horizon.

As shown in FIG. 24, weighting function $\sin^{200}\theta$ is used for the elevation angle below the horizon, while $\sin^2\theta$ is used for the elevation angle above the horizon. The effective radiation power can be obtained by executing the aforesaid integral calculation using these weighting functions.

Figure 25:
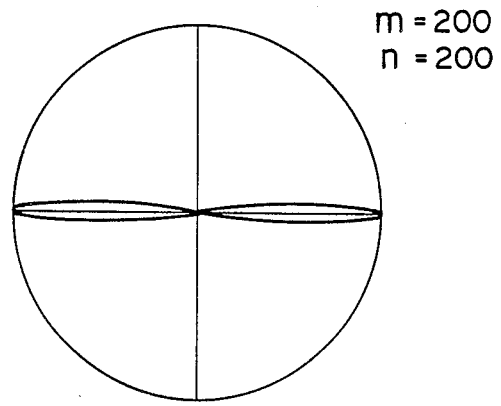
FIG. 25 is a diagram showing a weighting function concentrated on the horizon.
Figure 26:
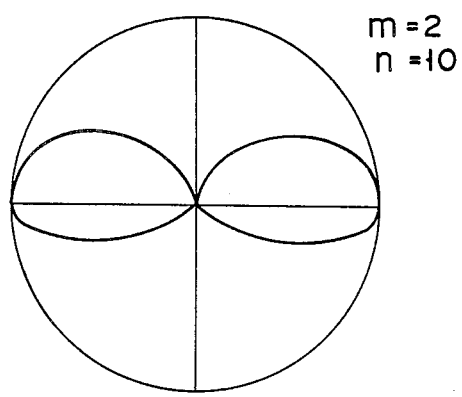
FIG. 26 is a diagram showing a weighting function having distribution also below the horizon.

When a car is running in the suburbs, radio waves from the base station converge substantially in the horizontal direction. In this case, the weighting function shown in FIG. 25 may be used which is concentrated on the horizon. When the car is running on a sloping road such that its posture or angle compared to the ground is not fixed, the distribution function shown in FIG. 26 may be used which is wide in the vertical direction. Naturally, the weighting function should be determined in consideration of the XPD.

Thus, the radiation field characteristics of the tested antenna with respect to the total solid angle thereof are accurately measured by means of the measuring apparatus according to the first or second embodiment. As a result, the effective radiation power is obtained with use of the arrival probability density function of the radio waves as the weighting function. In other words, the effective radiation power is obtained with use of the weighting function corresponding to the actual radio conditions In consequence, the evaluation index of the antenna is obtained on the basis of this effective radiation power.

Thus, the evaluation index of the antenna is obtained in due consideration of the actual radio conditions. Accordingly, the antenna evaluation index obtained in this third embodiment is best suited for the actual radio conditions.

Alternatively, the probability function of the polarized waves or the setting direction of the tested device may be used as the weighting function.

As described above, the experimental results were obtained from the radiation field characteristic measuring apparatus manufactured on an experimental basis, for the purpose of developing small built-in antennas. For the measurement of a substantially isotropic radio communication device using the VHF band, the rotating mechanism section of the measuring apparatus was formed of a nonmetallic material In order to evaluate the influence of the arm portion on the measurement results of the radiation characteristics, in particular, the theoretical values of the half-wavelength dipole antenna and the experimental results obtained from the apparatus of the present invention were compared. The results of the preparatory experiment indicated that the desired electrical characteristics cannot be obtained from an unhollowed design whose mechanical strength is emphasized. In order to obtain these electrical characteristics, therefore, the rotating mechanism section was experimentally improved. As a result, measurement results fully consistent with the theoretical values were able to be obtained for the particulars of the directivity. Also, the calibration for high-accuracy measurement, as well as the construction and function of the software for controlling the measuring apparatus, has been described herein. It was confirmed that the radiation efficiency of standard half-wavelength dipole antenna can be measured with a measurement accuracy within 1 dB, by means of the apparatus of the present invention. It is theoretically possible to obtain the radiation efficiency from the measurement results of the radiation field characteristics of the tested object, with respect to the total solid angle thereof, as in the case of the apparatus of the invention. Practically, however, such a method has been considered difficult, and no experimental results thereon have been reported yet. Moreover, the measuring apparatus of the present invention can measure the radiation efficiency of a small built-in antenna with higher accuracy and in a short period of time of one minute, so that it can efficiently obtain the radiation characteristics of the tested device. Furthermore, the apparatus of the invention, which enables the visual notice of the directivity with respect to the total solid angle, can be regarded as effective means for the development of the small built-in antennas.

TABLE 1

| Function of the software | |
|---|---|
| Item | Function |
| Operating system | Dialong type using mouse |
| Receiving system calibration | 5 dB step |
| Measurement mode | 2 polarized-wave simultaneous measurement Every polarized-wave measurement |
| Display | Map Directive gain Received power Cut plane |
| Auxiliary function | Friis transmission formula Automatic turning function Radiation power Radiation efficiency |

TABLE 2

| Radiation Efficiency of Standard Dipole Antenna | |
|---|---|
| Item | Power |
| Integral value of received power | 0.8 dBm |
| Actual gain of receiving antenna | 4.9 dBi |
| Radiation power | −4.1 dBm |
| Transmitted power | 2.9 dBm |
| Tested antenna | |
| Internal cable loss | 0.2 dB |
| Reflection loss | 0.3 dB |
| Radiation efficiency of tested antenna | −0.7 dB |

TABLE 3

Change of Radiation Efficiency Compared to Change of Mounting Angle

| | Radiation efficiency Mounting angle | | | | | |
|---|---|---|---|---|---|---|
| Condition Antenna | 0° (dB) | 45° (dB) | 90° (dB) | 180° (dB) | Mean value (dB) | Deviation (dB) |
| Half-wavelength dipole antenna | −0.7 | — | — | — | 0.7 | |
| Sample radio equipment (Type 1) | −21.8 | — | −21.9 | −22.6 | −22.1 | 0.8 |
| Sample radio equipment (Type 2) | −8.3 | −8.6 | −8.8 | −8.7 | −8.6 | 0.5 |
| Sample radio equipment (Type 3) | −9.1 | −9.3 | −9.7 | — | −9.4 | 0.6 |
| Sample radio equipment (Type 4) | −11.3 | — | −11.6 | — | −11.5 | 0.3 |

What is claimed is:

1. An apparatus for measuring electromagnetic field characteristics of a tested object which radiates/receives electromagnetic waves, said object having a first axis and a second axis extending at right angles thereto, comprising:

a first rotating member supporting the tested object;

rotating means for rotating the first rotating member around the first and second axes so that the tested object is rotated around the first and second axes; and measurement means, adapted to process the electromagnetic waves which are received when the object is rotated around the first and second axes, for measuring the electromagnetic field characteristics of the object with respect to the total solid angle thereof, said rotating means including:

a source of rotatory force for generating a rotatory force for rotating the first rotating member; and supporting and transmission means adapted to support the first rotating member for rotation around the first and second axes and transmit the rotatory force from the source of rotatory force to the first rotating member, said supporting and transmission means including a support for supporting the first rotating member for rotation around one of the axes so that the first rotating member is separated from the source of rotatory force, said support being formed of a non-metallic material adapted to suppress reflection and scattering of the electromagnetic waves, and said support having a space within its boundaries adapted to allow the electromagnetic waves to pass through said support, thereby suppressing the reflection and scattering of the electromagnetic waves.

2. The electromagnetic field characteristic measuring apparatus according to claim 1, wherein the intersection of said first and second axes is situated on the tested object.

3. The electromagnetic field characteristic measuring apparatus according to claim 1, wherein said space is a hollow cavity in said support.

4. The radiation field characteristic measuring apparatus according to claim 1, wherein said support has a honeycomb shape.

5. The electromagnetic field characteristic measuring apparatus according to claim 1, wherein said support is a foam member having a plurality of pores defining said space.

6. The electromagnetic field characteristic measuring apparatus according to claim 1, wherein said support has a plurality of rod members defining said space.

7. The electromagnetic field characteristic measuring apparatus according to claim 1, wherein said first rotating member is formed of a nonmetallic material adapted to suppress reflection and scattering of the electromagnetic waves, and has a space adapted to allow the electromagnetic waves to pass through the first rotating member, thereby suppressing the reflection and scattering of the electromagnetic waves.

8. The electromagnetic field characteristic measuring apparatus according to claim 7, wherein said space of said first rotating member is a hollow cavity.

9. The radiation field characteristic measuring apparatus according to claim 7, wherein said first rotating member has a honeycomb shape.

10. The electromagnetic field characteristic measuring apparatus according to claim 7, wherein said first rotating member is a foam member with a plurality of pores defining said space of said first rotating member.

11. The electromagnetic field characteristic measuring apparatus according to claim 2, wherein said supporting and transmission means includes a base fixedly fitted with the source of rotatory force and the support, and a nonmetallic second rotating member supporting the first rotating member for rotation around the first axis an supported for rotation around the second axis by means of the support.

12. The electromagnetic field characteristic measuring apparatus according to claim 11, wherein said second rotating member is formed of a nonmetallic material adapted to suppress reflection and scattering of the electromagnetic waves, and has a space adapted to allow the electromagnetic waves to pass through the second rotating member, thereby suppressing the reflection and scattering of the electromagnetic waves.

13. The electromagnetic field characteristic measuring apparatus according to claim 12, wherein said space of said second rotating member is a hollow cavity.

14. The radiation field characteristic measuring apparatus according to claim 12, wherein said second rotating member has a honeycomb shape.

15. The electromagnetic field characteristic measuring apparatus according to claim 12, wherein said second rotating member is a foam member having a plurality of pores defining said space of said second rotating member.

16. The electromagnetic field characteristic measuring apparatus according to claim 11, wherein said second rotating member includes a nonmetallic first arm supporting the first rotating member for rotation around the first axis and a nonmetallic second arm supported for rotation around the second axis by means of the support.

17. The electromagnetic field characteristic measuring apparatus according to claim 16, wherein said first rotating member includes a nonmetallic first shaft coaxial with the first axis and having one end fixed to the first rotating member, said support includes a nonmetallic cylindrical member coaxial with the second axis and rotatably supported by means of the support, and said second rotating member includes a nonmetallic second shaft coaxial with the second axis, rotatably supported by means of the cylindrical member, and having one end fixed to the second arm of the second rotating member.

18. The electromagnetic field characteristic measuring apparatus according to claim 17, wherein said source of rotatory force includes a first source of rotatory force for generating a rotatory force for rotating the first rotating member around the first axis, and a second source of rotatory force for generating a rotatory force for rotating the first rotating member around the second axis, and said supporting and transmission means includes first transmission means for transmitting the rotatory force from the first source of rotatory force to the first rotating member and second transmission means for transmitting the rotatory force from the second source of rotatory force to the first rotating member.

19. The electromagnetic field characteristic measuring apparatus according to claim 18, wherein said first and second transmission means each include a plurality of nonmetallic pulleys and a plurality of nonmetallic belts passed around and between the pulleys.

20. The electromagnetic field characteristic measuring apparatus according to claim 18, wherein said first transmission means includes a nonmetallic pulley attached to the first source of rotatory force, a nonmetallic pulley fixed to one end of the cylindrical member, said cylindrical member, a nonmetallic pulley fixed to the other end of the cylindrical member, a nonmetallic pulley fixed to the other end of the first shaft, said first shaft, and nonmetallic belts passed around and between said pulleys.

21. The electromagnetic field characteristic measuring apparatus according to claim 18, wherein said second transmission means includes a nonmetallic pulley attached to the second source of rotatory force, a nonmetallic pulley fixed to the other end of the second shaft, said second rotating member, and nonmetallic belts passed around and between said pulleys.

22. The electromagnetic field characteristic measuring apparatus according to claim 1, wherein said rotating means includes a radio wave absorber covering the source of rotatory force.

23. The electromagnetic field characteristic measuring apparatus according to claim 1, further comprising means for supplying a radio frequency signal to the tested object, said supply means including a radio frequency signal source and means for transferring the radio frequency signal from the radio frequency signal source to the tested object.

24. The radiation field characteristic measuring apparatus according to claim 23, wherein said transfer means includes a conductor line covered by ferrite.

25. The electromagnetic field characteristic measuring apparatus according to claim 24, wherein said supporting and transmission means includes a nonmetallic second rotating member supporting the first rotating member for rotation around the first axis, said second rotating member having a hollow nonmetallic second shaft coaxial with the second axis, and said conductor line is passed through the hollow second shaft.

26. The electromagnetic field characteristic measuring apparatus according to claim 23, wherein said transfer means includes means for converting the radio frequency signal into a light beam and transmitting the beam.

27. The electromagnetic field characteristic measuring apparatus according to claim 2, wherein said supporting and transmission means includes a base and a nonmetallic second rotating member supported for rotation around the second axis by means of the base, said second rotating member includes a pedestal fixedly fitted with the support, and said support supports the first rotating member for rotation around the first axis.

28. The electromagnetic field characteristic measuring apparatus according to claim 27, wherein said source of rotatory force includes a first source of rotatory force for generating a rotatory force for rotating the first rotating member around the first axis, and a second source of rotatory force for generating a rotatory force for rotating the first rotating member around the second axis, and said supporting and transmission means includes first transmission means for transmitting the rotatory force from the first source of rotatory force to the first rotating member and second transmission means for transmitting the rotatory force from the second source of rotatory force to the first rotating member.

29. The electromagnetic field characteristic measuring apparatus according to claim 28, wherein said first source of rotatory force is fixed to the pedestal of the second rotating member, said first rotating member includes a nonmetallic first shaft coaxial with the first axis, rotatably supported by means of the support, and having one end fixed to the first rotating member, and said first transmission means includes a nonmetallic pulley attached to the first source of rotatory force, a nonmetallic pulley fixed to the other end of the first shaft, said first shaft, and nonmetallic belts passed around and between said pulleys.

30. The electromagnetic field characteristic measuring apparatus according to claim 28, wherein said first rotating member includes a nonmetallic first shaft coaxial with the first axis, rotatably supported by means of the support, and having one end fixed to the first rotating member, and said first transmission means includes a nonmetallic gear unit attached to the first source of rotatory force, a nonmetallic gear unit fixed to the other end of the first shaft, and a nonmetallic propeller shaft coupled to the gear units.

31. The electromagnetic field characteristic measuring apparatus according to claim 28, wherein said second source of rotatory force is fixed to the base, and said second transmission means includes a nonmetallic second shaft coaxial with the second axis and connecting the second source of rotatory force and the pedestal of the second rotating member.

32. The electromagnetic field characteristic measuring apparatus according to claim 1, wherein said source of rotatory force includes an electric motor for generating the rotatory force for rotating the first rotating member.

33. The electromagnetic field characteristic measuring apparatus according to claim 1, wherein said source of rotatory force includes means for rotating the first rotating member by means of compressed gas.

34. The electromagnetic field characteristic measuring apparatus according to claim 1, wherein said measurement means includes detecting means for detecting the angles of rotation of the first rotating member around the first and second axes.

35. The electromagnetic field characteristic measuring apparatus according to claim 34, wherein said source of rotatory force includes an electric motor for generating the rotatory force for rotating the first rotating member, and said detecting means includes an encoder for detecting, from the electric motor, the angles of rotation of the first rotating member around the first and second axes.

36. The electromagnetic field characteristic measuring apparatus according to claim 34, wherein said detecting means includes means for optically detecting the angles of rotation of the first rotating member around the first and second axes.

37. The electromagnetic field characteristic measuring apparatus according to claim 2, wherein said supporting and transmission means includes means for positioning the first rotating member so that the intersection of the first and second axes is situated on the tested object.

38. The electromagnetic field characteristic measuring apparatus according to claim 2, wherein said first and second axes are an azimuth axis and an elevation axis, respectively.

39. A rotating apparatus used in an apparatus for measuring electromagnetic field characteristics of a tested object which radiates/receives electromagnetic waves and has a first axis and a second axis extending at right angles thereto, whereby the tested object is rotated around the first and second axes, comprising:
  a first rotating member supporting the tested object; and
  rotating means for rotating the first rotating member around the first and second axes so that the tested object is rotated around the first and second axes, said rotating means including:
  a source of rotatory force for generating a rotatory force for rotating the first rotating member; and
  supporting and transmission means adapted to support the first rotating member for rotation around the first and second axes and transmit the rotatory force from the source of rotatory force to the first rotating member, said supporting and transmission means including a support for supporting the first rotating member for rotation around one of the axes so that the first rotating member is separated from the source of rotatory force, said support being formed of a nonmetallic material adapted to suppress reflection and scattering of the electromagnetic waves, and said support having a space within its boundaries adapted to allow the electromagnetic waves to pass through said support, thereby suppressing the reflection and scattering of the electromagnetic waves.

40. An apparatus for measuring electromagnetic field characteristics of a tested object which radiates/receives electromagnetic waves, comprising:

a first rotating member supporting the tested object;

rotating means for rotating the first rotating member around first and second axes so that the tested object is rotated around the first and second axes; and measurement means, adapted to process the electromagnetic waves which are received when the object is rotated around the first and second axes, for measuring the electromagnetic field characteristics of the object with respect to the total solid angle thereof, and measuring the effective radiated power with use of the arrival probability density function of radio waves as a weighting function, whereby the effective radiated power is most appropriate for the evaluation index of the tested object, said rotating means including:

a source of rotatory force for generating a rotatory force for rotating the first rotating member; and supporting and transmission means adapted to support the first rotating member for rotation around the first and second axes and transmit the rotatory force from the source of rotatory force to the first rotating member, said supporting and transmission means including a support for supporting the first rotating member for rotation around one of the axes so that the first rotating member is separated from the source of rotatory force, said support being formed of a nonmetallic material adapted to suppress reflection and scattering of the electromagnetic waves, and said support having a space within its boundaries adapted to allow the electromagnetic waves to pass through said support, thereby suppressing the reflection and scattering of the electromagnetic waves.

41. The electromagnetic field characteristic measuring apparatus according to claim 40, wherein said measurement means determines said weighting function which is the probability of the arrival angle of radio waves.

42. The electromagnetic field characteristic measuring apparatus according to claim 40, wherein said measurement means determines said weighting function which is the probability function of polarized waves.

43. The electromagnetic field characteristic measuring apparatus according to claim 40, wherein said measurement means determines said weighting function which is the setting direction of the tested object.

* * * * *